United States Patent
Kon

(10) Patent No.: US 8,338,072 B2
(45) Date of Patent: Dec. 25, 2012

(54) RESIST COMPOSITION, RESIST PATTERN FORMING PROCESS, AND METHOD FOR MANUFACTURING SEMICONDUCTOR DEVICE

(75) Inventor: Junichi Kon, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 798 days.

(21) Appl. No.: 11/859,930

(22) Filed: Sep. 24, 2007

(65) Prior Publication Data

US 2008/0076252 A1  Mar. 27, 2008

(30) Foreign Application Priority Data

Sep. 26, 2006 (JP) ................. 2006-260836

(51) Int. Cl.
G03C 5/00 (2006.01)
G03F 7/00 (2006.01)

(52) U.S. Cl. .................. 430/269; 430/270.1; 430/281.1; 430/283.1; 430/284.1

(58) Field of Classification Search ............. None
See application file for complete search history.

(56) References Cited

U.S. PATENT DOCUMENTS

| | | | | |
|---|---|---|---|---|
| 4,444,868 A * | 4/1984 | Ichimura | | 430/285.1 |
| 5,576,143 A * | 11/1996 | Aoai et al. | | 430/270.1 |
| 6,143,472 A * | 11/2000 | Sumino et al. | | 430/283.1 |
| 6,555,607 B1 | 4/2003 | Kanda et al. | | |
| 6,566,040 B1 | 5/2003 | Sugino et al. | | |
| 6,579,657 B1 | 6/2003 | Ishibashi | | |
| 6,673,511 B1 * | 1/2004 | Hatakeyama et al. | | 430/270.1 |
| 7,108,955 B2 * | 9/2006 | Iwasawa et al. | | 430/270.1 |
| 2003/0098464 A1 | 5/2003 | Kon et al. | | |
| 2004/0029047 A1 | 2/2004 | Ishibashi et al. | | |
| 2004/0072098 A1 | 4/2004 | Kozawa et al. | | |
| 2006/0188807 A1 | 8/2006 | Nozaki et al. | | |
| 2009/0004598 A1 | 1/2009 | Nakagawa et al. | | |

FOREIGN PATENT DOCUMENTS

| | | |
|---|---|---|
| EP | 1429185 A1 | 6/2004 |
| JP | 62-65326 A | 3/1987 |
| JP | 5-197151 A | 8/1993 |
| JP | 10-73927 A | 3/1998 |
| JP | 11-204399 A | 7/1999 |
| JP | 11-283910 A | 10/1999 |
| JP | 2000-58506 A | 2/2000 |
| JP | 2000-267268 A | 9/2000 |

(Continued)

OTHER PUBLICATIONS

Japanese Office Action dated May 31, 2011, issued in corresponding Japanese Patent Application No. 2006-260836.

(Continued)

*Primary Examiner* — Duy Deo
(74) *Attorney, Agent, or Firm* — Westerman, Hattori, Daniels & Adrian, LLP

(57) ABSTRACT

To provide a resist composition capable of prevention of the formation of abnormal resist pattern shapes for efficient, high-precision formation of fine, high-resolution resist patterns, a resist pattern forming process capable of efficient, high-precision formation of finer, high-resolution resist patterns by using the resist composition, and a method for manufacturing a semiconductor device. The resist composition of the present invention includes a base resin, a photoacid generator, a first additive, and a second additive, wherein the pKa of the second additive is higher than the pKa of the first additive, and at a resist formation temperature, the vapor pressure of the second additive is lower than the vapor pressure of the first additive.

17 Claims, 27 Drawing Sheets

FOREIGN PATENT DOCUMENTS

| | | |
|---|---|---|
| JP | 2000-298356 A | 10/2000 |
| JP | 2000-347414 A | 12/2000 |
| JP | 2001-19860 A | 1/2001 |
| JP | 2001-033984 A | 2/2001 |
| JP | 2001-228616 A | 8/2001 |
| JP | 3237082 B2 | 10/2001 |
| JP | 2002-6491 A | 1/2002 |
| JP | 2002-6498 A | 1/2002 |
| JP | 2002-6512 A | 1/2002 |
| JP | 2002-49161 A | 2/2002 |
| JP | 2003-84457 A | 3/2003 |
| JP | 2003-131400 A | 5/2003 |
| JP | 2003-162060 A | 6/2003 |
| JP | 2004-53723 A | 2/2004 |
| JP | 2004-86203 A | 3/2004 |
| JP | 2004-101947 A | 4/2004 |
| JP | 2004-126080 A | 4/2004 |
| JP | 2004-264373 A | 9/2004 |
| JP | 2005-91415 A | 4/2005 |
| JP | 2005-208365 A | 8/2005 |
| JP | 2006-106693 A | 4/2006 |
| JP | 2006-259692 A | 9/2006 |
| WO | 2004074941 A1 | 2/2004 |

OTHER PUBLICATIONS

M. Terai et al.; "Below 70-nm Contact Hole Pattern with RELACS Process on ArF Resist"; Proceedings of SPIE, vol. 5039, pp. 789-797, 2003.

Takeo Ishibashi et al.; "Advanced Micro-Lithography Process with Chemical Shrink Technology"; The Japan Society of Applied Physics; vol. 40, Part 1, No. 1, pp. 419-425, Jan. 2001.

Prior Art Information List.

* cited by examiner

Electron beam

Phosphorous or arsenic
(conductive impurity)

RESIST COMPOSITION, RESIST PATTERN FORMING PROCESS, AND METHOD FOR MANUFACTURING SEMICONDUCTOR DEVICE

CROSS-REFERENCE TO RELATED APPLICATIONS

This application is based upon and claims the benefits of the priority from the prior Japanese Patent Application No. 2006-260836 filed on Sep. 26, 2006, the entire contents of which are incorporated herein by reference.

BACKGROUND OF THE INVENTION

1. Field of the Invention

The present invention relates to a resist composition suitable for the formation of fine, high-resolution resist patterns, a resist pattern forming process using the resist composition, and a method for manufacturing a semiconductor device using the resist composition.

2. Description of the Related Art

Currently, the scale of integration of semiconductor integrated circuits has been increasing to a level that enables practical use of LSIs and VLSIs, with the linewidth of interconnection patterns reduced to as small as 0.2 µm or less and with a minimum linewidth of 0.1 µm or less achieved. The lithography technology is extremely important in the formation of finer interconnection patterns; the lithography technology comprises the steps of coating a workpiece substrate with a resist film, selectively exposing the resist film followed by development to form a resist pattern, dry-etching the substrate while using the resist pattern as a mask, and removing the resist pattern to obtain desired patterns (e.g., interconnection patterns). Attempts have now been made in this lithography technology to achieve formation of much finer patterns by reducing the wavelength of exposure light (i.e., light used for exposure) and further by using electron beams and/or X-rays.

Chemically amplified resists containing photoacid generators hold promise as resist materials that are applicable to lithography using electron beams, X-rays, etc. Irradiating the chemically amplified resist for instance with an electron beam, X-ray, or focused ion beam causes generation of acid from the photoacid generator, and subsequent baking process causes catalyzed reactions by which portions of the resist irradiated with the electron beam are made alkali soluble (for positive-type resists) or alkali insoluble (for negative-type resists). Thus the chemically amplified resists can be made highly sensitive to actinic radiation by increasing apparent quantum efficiency. These chemically amplified resists generally comprise a base resin, a photoacid generator, various additives, an organic solvent, and the like. Among them, negative-type chemically amplified resists comprise a crosslinking agent in addition to these ingredients.

In the lithography process using an electronic beam, electrons entering the resist film carry electric charge and thus they interact with the atomic nuclei and electrons of substances present in the resist composition upon application of the electron beam. For this reason, when an electron beam is incident on a positive-type resist film 210 formed on a substrate as shown in FIG. 26A and on a negative-type resist film 220 formed on a substrate 200 as shown in FIG. 26B, beam scattering (forward scattering) occurs, and thereby the beam-irradiated area of each of the resist films 210 and 220 becomes larger at bottom than at surface. As a result, the cross section of the resist space pattern of the positive-type resist (i.e., an opening 214 between adjacent lines of a resist pattern 212), obtained after development, has a reverse tapered shape as shown in FIG. 26C, whereas the cross section of the resist space pattern of the negative-type resist (i.e., an opening 224 between adjacent lines of a resist pattern 222), obtained after development has a forward tapered shape as shown in FIG. 26D.

The formation of such abnormal resist pattern shapes, especially reverse tapered shapes, prevents accurate measurement of pattern dimensions (as viewed from the top), making it difficult to achieve fine patterning upon manufacture of semiconductor devices.

The abnormal pattern shapes involved in the lithography using an electron beam is a reflection of electron beam scattering profile; the greater the resolution of the resist the greater the reproducibility of the electron beam scattering profile on the resist, and hence the pattern shapes become worse to a greater extent. To overcome this problem the following method has been adopted in the art: The resolution of the resist film is reduced by adjusting the alkali solubility of the resist material, allowing the resist film to gradually dissolve from outer surface toward substrate to form a resist pattern with a small taper angle, or a substantially vertical resist pattern. This method, however, has met with difficulty in forming finer patterns because the pattern size obtained after development is significantly large compared to the electron beam-irradiated area.

For example, Japanese Patent Application Laid-Open No. 2005-91415 discloses a method of forming a resist pattern with a space pattern whose cross section has a forward tapered shape, wherein the resist pattern is produced by using a positive-type resist material whose glass transition temperature increases by irradiation with an electron beam, and the surface of the resist pattern is irradiated with an electron beam to increase the glass transition temperature of the upper layer of the resist pattern followed by baking to fluidize the non-irradiated lower layer of the resist pattern to allow the lower opening to shrink. This method, however, is directed to first form a resist pattern with openings whose cross sectional shapes are rectangular and then make them forward tapered, rather than forming a resist pattern with openings whose cross sectional shapes are forward tapered by preventing them being reversed tapered. In addition, this method is inefficient due to the fact that various processes follow the formation of resist pattern.

Moreover, JP-A No. 2005-208365 discloses a positive-type resist composition capable of formation of shapes with an excellent pattern profile, which is achieved by the addition of acid-decomposable resin having a specific structure, and discloses the fact that it is preferable for this positive-type resist composition to further contain a basic compound in order to minimize change in its ability from exposure to heating. This positive-type resist composition, however, merely incorporates therein a single basic compound and thus is insufficient for high-precision control of the taper angles of openings of a resultant resist pattern.

Thus, the current situation is that there has not been provided any resist composition and related technologies, which are capable of prevention of the formation of abnormal resist pattern shapes for efficient, high-precision formation of fine, high-resolution resist patterns.

SUMMARY OF THE INVENTION

The resist composition of the present invention includes a base resin, a photoacid generator, a first additive, and a second additive, wherein the pKa of the second additive is higher than the pKa of the first additive, and at a resist formation temperature, the vapor pressure of the second additive is lower than the vapor pressure of the first additive.

The method of the present invention for manufacturing a semiconductor device includes forming a resist pattern over a work surface by means of a resist pattern forming process, and patterning the work surface by etching using the resist pattern as a mask.

Figure 1A:
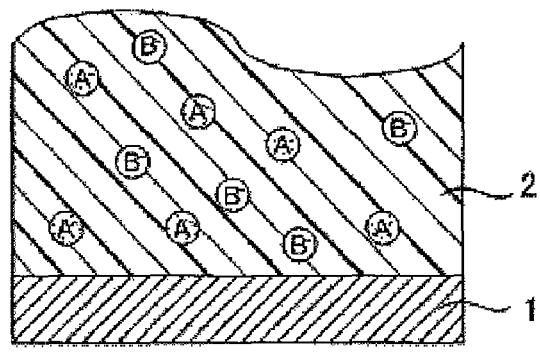
FIG. 1A is an explanatory diagram of a mechanism by which a resist pattern is formed using the resist composition of the present invention, showing a state where a resist film has been formed.

DESCRIPTION OF THE PREFERRED EMBODIMENTS (Resist Composition)

The resist composition of the present invention comprises at least a base resin, a photoacid generator, and at least two different additives, and where necessary, further comprises an organic solvent and additional ingredient(s) such as a surfactant appropriately selected.

The resist composition of the present invention is preferably a positive-type resist composition due to the fact that abnormal resist pattern shapes can be effectively avoided when it is irradiated with ionized radiation (e.g., electron beam) for resist pattern formation.

—Additives—

It is required to use at least two different additives (first and second additives) that satisfy the following requirements: The pKa of the second additive needs to be higher than the pKa of the first additive, and at a resist formation temperature (i.e., the temperature at which a resist film is formed), the vapor pressure of the second additive needs to be lower than the vapor pressure of the first additive.

Since the vapor pressure of the second additive is lower than that of the first additive at the resist formation temperature, the second additive is localized in the lower portion of the resist film. Moreover, since the pKa of the second additive is higher than that of the first additive, the basicity of the lower portion of the resist film increases and thereby acids generated by irradiation of the resist composition with ionized radiation upon patterning process are neutralized, inhibiting reactions in the base resin and allowing control of the taper angles of the openings as viewed in cross section of the resist pattern.

The pKa—the negative logarithm of the acid dissociation constant (Ka)—of each of the first and second additives is not particularly limited as long as the pKa of the second additive is higher than that of the first additive, and can be appropriately set depending on the intended purpose; however, it is preferable that the pKa value of the second additive be higher than that of the first additive by 2 or more, more preferably 3 or more.

If the difference in pKa value between the first and second additives is less than 2, it results in failure to obtain differences in the degree of neutralization of acids over the thickness of the resist film that have been generated by irradiation of the resist composition with ionized radiation. Thus, the taper angles of the openings as viewed in cross section of the resist space pattern (i.e., openings between adjacent lines of the resist pattern) may not be sufficiently controlled.

The pKa's of the first and second additives are not particularly limited and can be appropriately set depending on the intended purpose; the pKa of each of the first and second additives is preferably 4 or more, more preferably 6 or more.

A pKa value of less than 4 causes the first and second additives to react with the base resin, which may prevent exhibition of resist material functions.

The vapor pressures of the first and second additives at the resist formation temperature are not particularly limited as long as the vapor pressure of the second additive is lower than that of the first additive, and can be appropriately set depending on the intended purpose; however, it is preferable that the vapor pressure of the second additive be lower than that of the first additive by 26.66 kPa (200 Torr) or more.

If the difference in vapor pressure between the first and second additives is less than 26.66 kPa (200 Torr), these additives fail to be localized in the resist film. Thus, the taper angles of the openings as viewed in cross section of the resultant resist pattern cannot be sufficiently controlled.

The vapor pressures of the first and second additives at the resist formation temperature are not particularly limited and can be appropriately set depending on the intended purpose; however, it is preferable that the vapor pressure of each of the first and second additives be 101.308 kPa (760 Torr) or less.

A vapor pressure of greater than 101.308 kPa (760 Torr) causes the additives to evaporate from the resist film to a greater extent during heating (baking) treatment for resist film deposition. Thus, it may result in failure to sufficiently control the taper angles of the openings as viewed in cross section of the resultant resist pattern.

The resist formation temperature is not particularly limited and can be appropriately set depending on the intended purpose; for example, the resist formation temperature is preferably 40° C. to 150° C., more preferably 80° C. to 120° C.

A resist formation temperature of less than 40° C. may result in insufficient evaporation of solvent contained in the resist film, whereas a resist formation temperature of greater than 150° C. may soften the resist film.

The mole ratio of the first additive to the second additive, added in the resist composition, is not particularly limited and can be appropriately set depending on the intended purpose; however, the first additive-to-second additive ratio is preferably in the range of 1/10 to 10/1.

If the foregoing mole ratio falls outside this range, it results in poor localization of these additives in the resist film thickness direction, and there is no difference in the degree of neutralization of acids over the thickness of the resist film, which the acids have been generated by irradiation of the resist composition with ionized radiation. Thus, it may result in failure to sufficiently control the is taper angles of the openings as viewed in cross section of the resultant resist pattern.

It is only necessary for the resist composition of the present invention to comprise at least the two different additives—the first and second additives. In addition to these additives, the resist composition of the present invention may further comprise an additional additive, e.g., a third additive. In this case it is preferable that the pKa of the third additive be higher than that of the second additive and that at a resist formation temperature, the vapor pressure of the third additive be lower than that of the second additive.

In this case, at the resist formation temperature, the vapor pressure decreases in the order of third additive, second additive, first additive. For this reason, these additives are localized in the resist film in order of increasing vapor pressure (i.e., in the order of first additive, second, and third additives), from top to bottom of the resist film. Moreover, as the pKa increases in the order of third additive, second additive and first additive, the basicity of the resist film increases from top to bottom of the resist film. Thus, in the lower portion of the resist film, acids generated by irradiation of the resist composition with ionized radiation upon patterning process are neutralized to a greater extent inhibiting reactions in the base resin and allowing control of the taper angles of the openings as viewed in cross section of the resultant resist pattern.

When the third additive is intended to be added in the resin composition in addition to the first and second additives, the added amounts of these additives are not particularly limited and can be appropriately set depending on the intended purpose; these additives are preferably added in equimolar amounts.

The first, second and third additives are not particularly limited and each can be appropriately selected depending on the intended purpose; however, suitable examples include carboxylic acids and nitrogen-containing compounds.

Examples of carboxylic acids include formic acid (pKa=3.54), acetic acid (pKa=4.76), lactic acid (pKa=3.64), butyric acid (pKa=4.57), valeric acid (pKa=5.17), vinyl acetic acid (pKa=4.12), propionic acid (pKa=4.62), succinic acid (pKa=3.99), benzoic acid (pKa=4.00), fumaric acid (pKa=3.07), and malonic acid (pKa=2.60).

Suitable examples of nitrogen-containing compounds include aliphatic amines and aromatic amines.

Examples of aliphatic amines include methylamine (pKa=10.51), dimethylamine (pKa=11.02), ethylamine (pKa=10.66), diethylamine (pKa=11.02), triethylamine (pKa=10.68), propylamine (pKa=10.93), butylamine (pKa=10.77), pentylamine (pKa=10.93), cyclopentylamine (pKa=10.56), hexylamine (pKa=10.85), cyclohexylamine (pKa=10.62), heptylamine (pKa=10.66), ethylenediamine (pKa=7.12), benzylamine (pKa=9.43), 2-aminoethanol (pKa=9.64), diethanolamine (pKa=8.87), triethanolamine (pKa=7.76), hydroxylamine (pKa=6.14), piperazine (pKa=5.68), piperidine (pKa=11.24), and pyrrolidine (pKa=11.40).

Examples of aromatic amines include aniline (pKa=4.63), methylaniline (pKa=4.44-4.79), dimethylaniline (pKa=5.07), quioline (pKa=4.97), isoquinoline (pKa=5.14), imidazole (pKa=7.04), diphenylamine (pKa=13.65), 1-naphthylamine (pKa=3.98), 2-hydroxybenzylamine (pKa=8.63), pyridine (pKa=5.67), and methylpyridine (pKa=5.80-6.10).

The method of determining the presence of the first, second and third additives in the resist composition is not particularly limited, and any known method can be used; for example, a Fourier Transform Infrared Spectrometer (PT-IR), or a Nuclear Magnetron Resonance (NMR) spectrometer can be used.

—Base Resin—

The base resin is not particularly limited as long as it is water soluble or alkali soluble, and can be appropriately selected from those known in the art depending on the intended purpose; examples include novolac resins, polyvinylphenol resins, acrylic resins, cycloolefin resins, and derivatives thereof. The resins may be used singly or in combination.

The base resin preferably has an acid-cleavable protecting group in view of the fact that its solubility in a developer can be controlled.

The acid-cleavable protecting group is not particularly limited and can be appropriately selected depending on the intended purpose; examples include tertiary alkyloxycarbonyl groups such as tert-butoxycarbonyl group and tert-amyloxycarbonyl group; tertiary alkoxycarbonylalkyl groups such as tert-butoxycarbonylmethyl group; tertiary alkyl groups such as tert-butyl group; alkoxyalkyl groups such as ethoxyethyl group and methoxypropyl group; acetal groups such as tetrahydropyranyl group and tetrahydrofuranyl group; benzyl group; and trimethylsilyl group.

—Photoacid Generator—

The photoacid generator, when added in the resist composition, can effectively initiate reactions in the resist composition by irradiation with ionized radiation.

The photoacid generator is not particularly limited and can be appropriately selected depending on the intended purpose; examples include iodonium salts, sulphonium salts, halogen compounds, sulfonate compounds, imide compounds, carbonyl compounds, disulfones, α,α-bis(allylsulfonyl)diazomethanes, and diazonium salts. These compounds may be used singly or in combination.

Iodonium salts are not particularly limited and can be appropriately selected; for examples, those shown below are suitable.

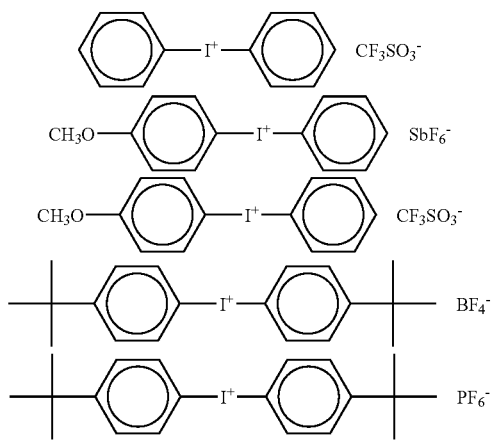

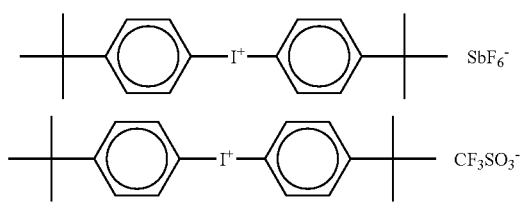
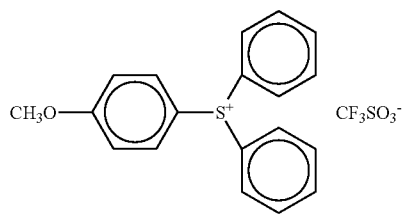
Sulphonium salts are not particularly limited and can be appropriately selected; for examples, those shown below are suitable.
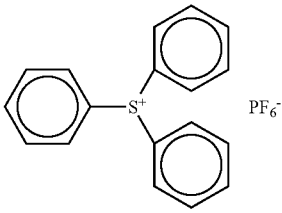
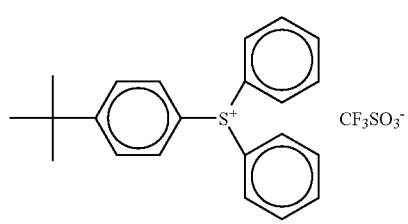
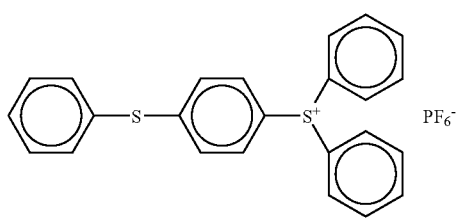
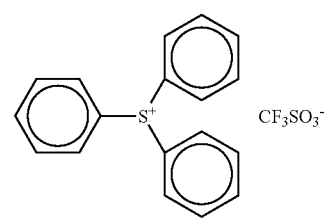
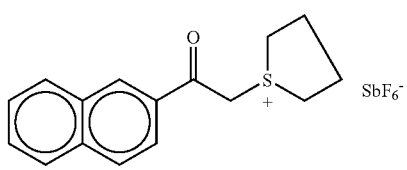
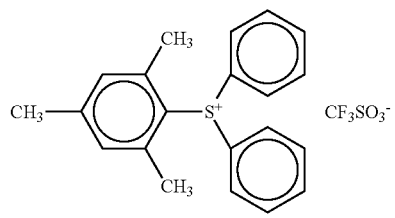
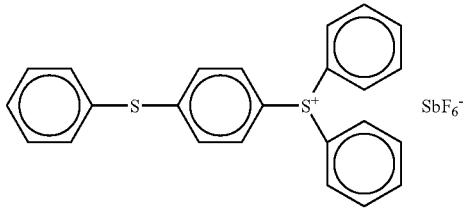
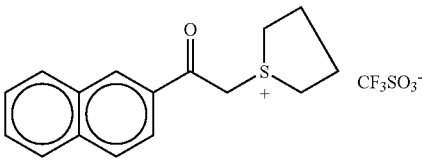
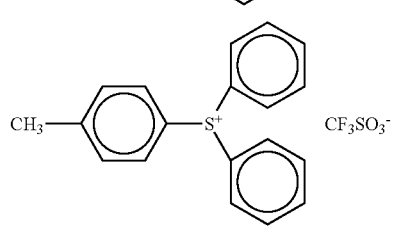
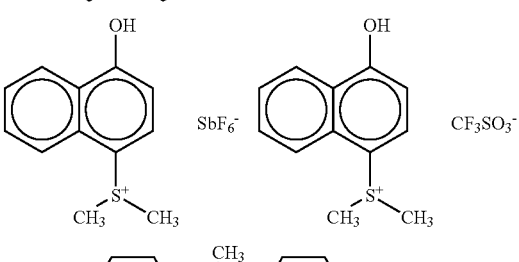
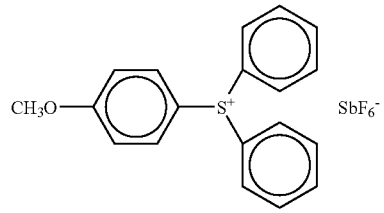
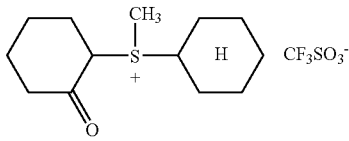
Halogen compounds are not particularly limited and can be appropriately selected; for examples, those shown below are suitable.

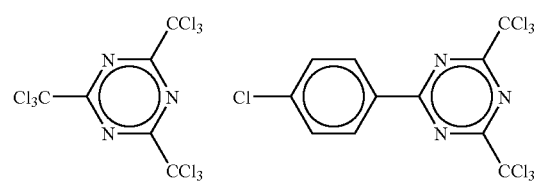
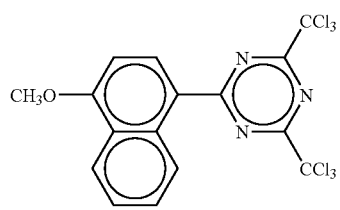
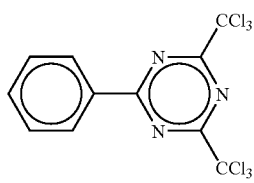
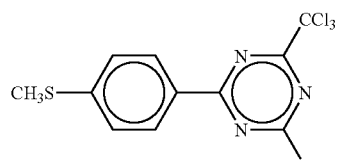
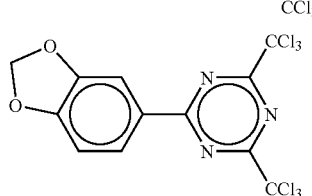
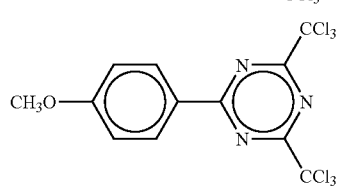
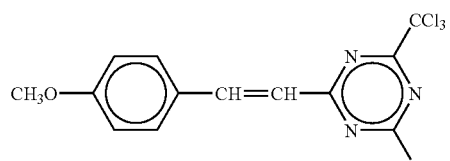
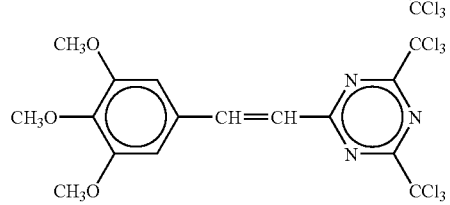
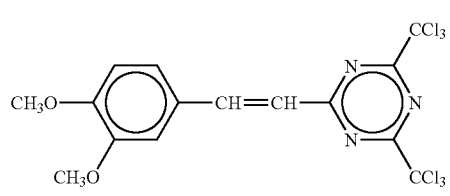
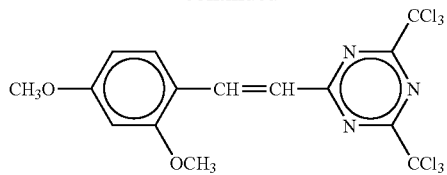
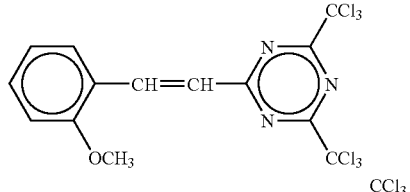
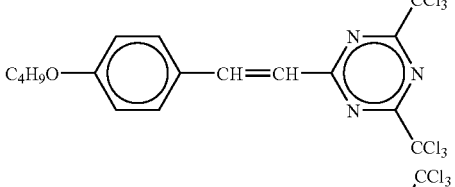
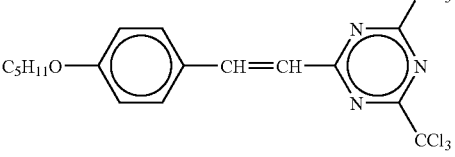
Sulfonate compounds are not particularly limited and can be appropriately selected; for examples, those shown below are suitable.
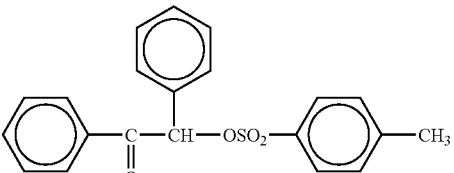
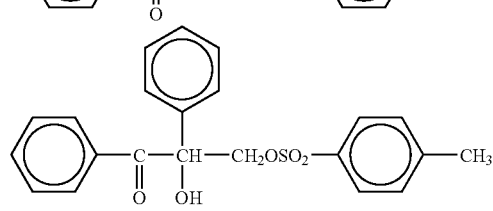
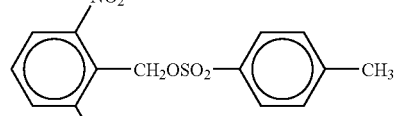
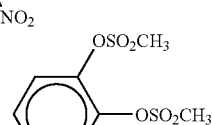
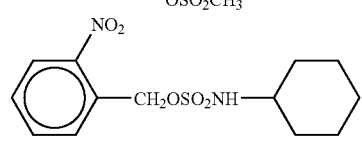

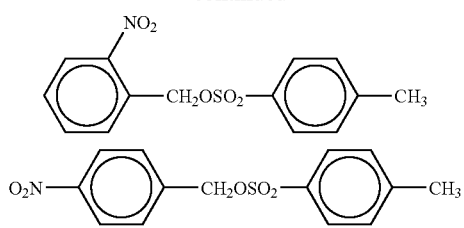

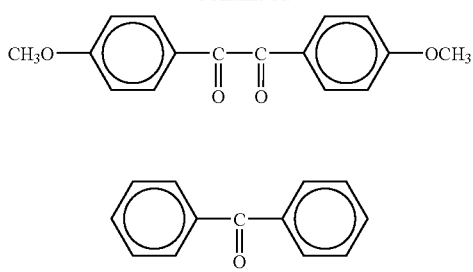

Imide compounds are not particularly limited and can be appropriately selected; for examples, those shown below are suitable.

Disulfones are not particularly limited and can be appropriately selected; for examples, those shown below are suitable.

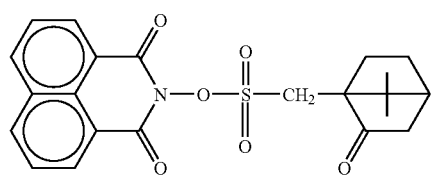

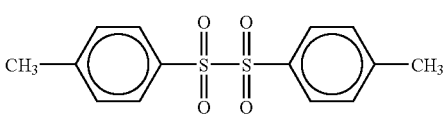

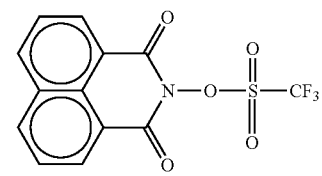

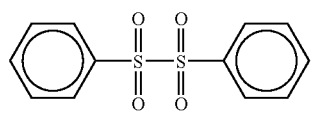

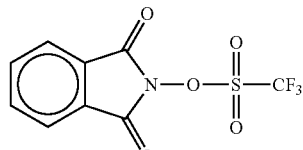

α,α-Bis(allylsulfonyl)diazomethanes are not particularly limited and can be appropriately selected; for examples, those shown below are suitable.

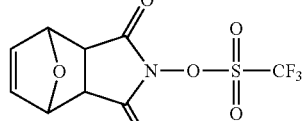

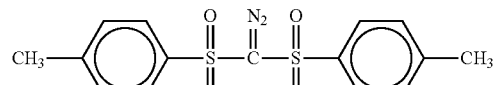

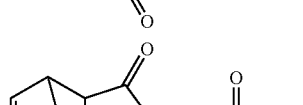

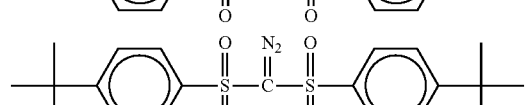

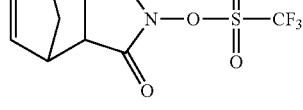

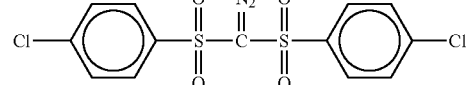

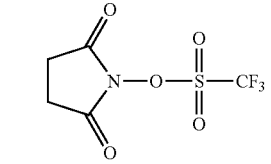

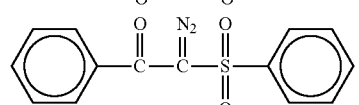

Carbonyl compounds are not particularly limited and can be appropriately selected; for examples, those shown below are suitable.

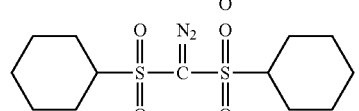

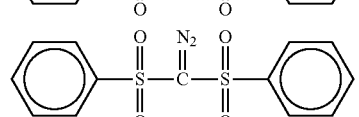

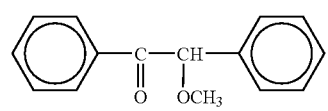

Diazonium salts are not particularly limited and can be appropriately selected; for examples, those shown below are suitable.

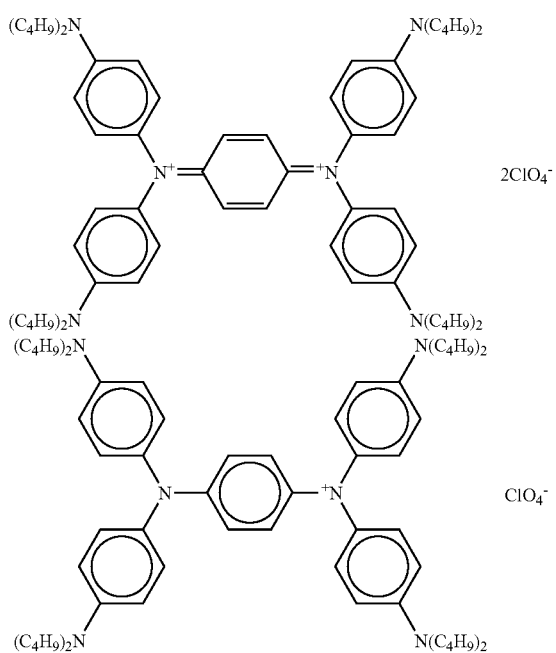

The content of the photoacid generator in the resist composition is not particularly limited and can be appropriately set depending on the intended purpose; however, the content of the photoacid generator is preferably 1 part by mass to 30 parts by mass, more preferably 3 parts by mass 20 parts by mass per 100 parts by mass of the base resin.

A photoacid generator content of less than 1 part by mass may result in poor reactivity to cause reduction in exposure sensitivity, whereas a photoacid generator content of greater than 30 parts by mass may result in poor resist film deposition capability and hence the resolution of the resultant resist film may decreased due to poor contrast.

—Organic Solvent—

The organic solvent is not particularly limited as long as it is capable of dissolving the resist composition ingredients, has a moderate drying speed and can provide uniform, smooth coating after its evaporation, and can be appropriately selected from those that are generally used as coating solvents. Specific examples include glycol ether esters, glycol ethers, esters, ketones, cyclic esters, and alcohols. These organic solvents may be used singly or in combination.

Examples of glycol ether esters include ethyl cellosolve acetrate, methyl cellosolve acetate, propylene glycol monomethylether acetate, and propylene glycol monoethylether acetate.

Examples of glycol ethers include ethyl cellosolve, methyl cellosolve, propylene glycol monomethylether, and propylene glycol monoethylether.

Examples of esters include ethyl lactate, butyl acetate, amyl acetate and ethyl pyruvate.

Examples of ketones include 2-heptanone and cyclohexanone.

Examples cyclic esters include γ-butyrolactone.

Examples of alcohols include methanol ethanol, propanol, isopropanol and butanol.

—Additional Ingredient—

The additional ingredient is not particularly limited as long as the effect of the present invention is not impaired, and can be appropriately selected depending on the intended purpose.

When intending to improve the solubility and/or coating capability of the resist composition, isopropyl alcohol and/or a surfactant may be added.

The surfactant is not particularly limited and can be appropriately selected depending on the intended purpose; examples include nonionic surfactants, cationic surfactants, anionic surfactants and amphoteric surfactants. These surfactants may be used singly or in combination. Among them, nonionic surfactants are preferable in view of the absence of metallic ions.

Suitable examples of nonionic surfactants include alkoxylate surfactants, fatty acid ester surfactants, amide surfactants, alcohol surfactants and ethylenediamine surfactants; specific examples thereof include polyoxyethylene-polyoxypropylene condensation products, polyoxyalkylene alkyl ethers, polyoxyethylene alkyl ethers, polyoxyethylene derivatives, sorbitan fatty acid esters, glycerine fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, natural alcohols, ethylenediamines and secondary alcohol ethoxylates.

Cationic surfactants are not particularly limited and can be selected depending on the intended use; examples thereof include alkyl cationic surfactants, amide quaternary cationic surfactants and ester quaternary cationic surfactants.

Amphoteric surfactants are not particularly limited and can be appropriately selected depending on the intended use; examples thereof include amine oxide surfactants and betaine surfactants.

The content of the surfactant in the resist composition can be appropriately set depending on the type, content, etc., of the foregoing additives, the organic solvent, etc.

—Usage—

Figure 1B:
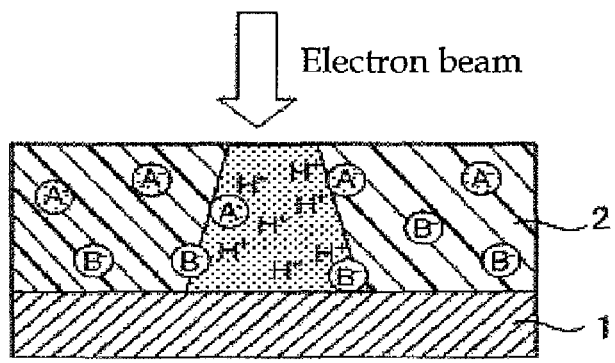
FIG. 1B is an explanatory diagram of a mechanism by which a resist pattern is formed using the resist composition of the present invention, showing a state where the resist film has been irradiated with an electron beam.
Figure 1C:
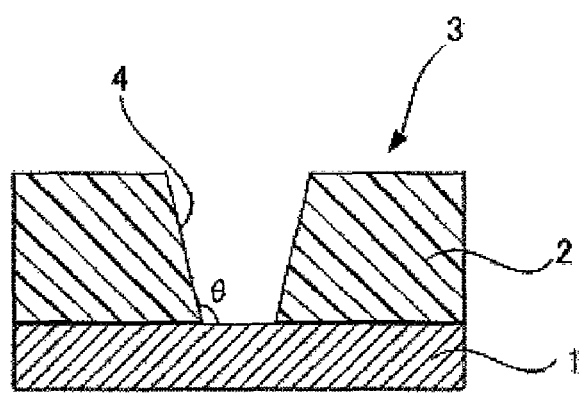
FIG. 1C is an explanatory diagram of a mechanism by which a resist pattern is formed using the resist composition of the present invention, showing a state where a resist pattern has been formed.

The resist composition of the present invention can be suitably used for the formation of resist patterns. As shown in FIG. 1A, for example, when the resist composition of the present invention is applied over a work surface 1, it results in the formation of a resist film 2 in which a first additive A and a second additive B are uniformly distributed. The resist film 2 is then heated. At this point, since the vapor pressure of the second additive B is lower than that of the first additive A at the heating temperature (resist formation temperature) of this heat treatment as shown in FIG. 1B, the first and second additives A and B are localized in the upper and lower portions of the resist film 2, respectively. The resist film 2 is then selectively irradiated with ionized radiation. Here, in the case where an electron beam is employed as the ionized irradiation, beam scattering (forward scattering) occurs when the electron beam is incident on the resist film 2 and thereby the beam-irradiated area of the resist film 2 becomes larger at bottom than at surface. However, since the pKa of the second additive B present in the lower portion of the resist film 2 is higher than that of the first additive A present in the upper portion of the resist film 2, acids generated by irradiation of the resist film 2 with the ionized radiation are neutralized and thereby reactions occurring in the base resin are inhibited. Thereafter, the resist film 2 is heated, followed by development. In the case where the resist composition is a positive-type resist composition, a resist pattern 3 is formed as shown in FIG. 1C, in which the cross sectional shape of the opening 4 is rectangular or forward tapered (i.e., the angle θ in the opening 4 between the lines of the resist pattern 3 is 90° or more). The resist pattern 3 contains fine, high-resolution lines and is suitably used as a mask for etching during the manufacture of a semiconductor device.

The resist composition of the present invention is capable of high-precision formation of fine, high-resolution resist patterns by preventing the occurrence of abnormal resist pattern shapes, and thus can be suitably used both in the resist pattern forming method of the present invention and the method of the present invention for manufacturing a semiconductor device, which will be described below.

(Resist Pattern Forming Process)

The resist pattern forming process of the present invention includes at least a resist film forming step, an ionized radiation irradiation step, a heating step, and a development step, and where necessary, further includes additional step(s) appropriately selected.

<Resist Film Forming Step>

The resist film forming step is a step of forming a resist film by coating a work surface with the resist composition of the present invention and heating the resist composition.

The work surface (base) is not particularly limited and can be appropriately selected depending on the intended purpose. In a case where the resist film is to be used for the manufacture of an electronic device such as a semiconductor device, a surface of a semiconductor substrate can be exemplified as the work surface (base). More specifically, suitable examples include silicon wafers and various oxide films.

The method of coating is not particularly limited and can be appropriately selected from known coating methods. For example, spin coating or the like is preferably used. In the case of spin coating, preferable spin coating conditions are as follows: rotational speed is, for example, about 100 rpm to 10,000 rpm, more preferably 800 rpm to 5,000 rpm; and spin time is, for example, about 1 second to 10 minutes, more preferably about 1 second to 90 seconds.

The thickness of coating is not particularly limited and can be appropriately set depending on the intended purpose.

The heating is preferably conducted upon or after application of the resist composition, to dry the resist composition.

The method of heating and the conditions used for this method are not particularly limited as long as the resist composition applied over the work surface is not softened, and can be appropriately determined depending on the intended purpose; for example, heating temperature is preferably 40° C. to 150° C., more preferably 80° C. to 120° C.

A heating temperature of less than 40° C. may result in insufficient evaporation of solvent contained in the resist film (resist composition), whereas a heating temperature of greater than 150° C. may soften the resist film.

In addition, the heating time is preferably 10 seconds to 5 minutes, more preferably 30 seconds to 90 seconds.

Through these steps the resist composition is applied over the work surface and heated to form the resist film. At this point, heating of the resist composition causes the second additive—an additive with a lower vapor pressure than the first additive at the resist formation temperature—to be localized in the lower portion of the resist film being made.

<Ionized Radiation Irradiation Step>

The ionized radiation irradiation step is a step of selectively irradiating the resist film with ionized radiation.

Irradiation of ionized radiation causes decomposition of the photoacid generator in the irradiated areas of the resist composition to yield acids which in turn cure the selected areas of the resist film. In this way a latent pattern image forms in the resist film.

Selective irradiation of some areas of the resist film with ionized radiation causes changes in polarity in those areas, which are then removed from the resist film—a resist film made of the positive-type resist composition—in the subsequent development step to be described later, revealing non-reacted areas of the resist film to form a resist pattern.

The ionized radiation is not particularly limited and can be appropriately selected depending on the intended purpose; charged particle beams and X-rays are suitable examples. Charged particle beams are more preferable because fine, high-resolution patterns can be formed.

The charged particle beams are not particular limited and can be appropriately selected depending on the intended purpose; examples include high-energy rays such as an electron beam and a focused ion beam.

Through this step the resist film is selectively irradiated with the ionized radiation.

<Heating Step>

The heating step is a step of heating the resist film which has been selectively irradiated with the ionized radiation in the ionized radiation irradiation step.

This heating step facilitates polarity changing reactions in areas of the resist film that have been irradiated with the ionized radiation irradiation.

The heating temperature in the heating step is not particularly limited and can be appropriately set depending on the intended purpose; however, the heating temperature is preferably 50° C. to 200° C., more preferably 70° C. to 180° C.

A heating temperature of less than 50° C. may result in poor polarity changing reactions, whereas a heating temperature of greater than 200° C. may result in thermal decomposition of the ingredients in the resist composition.

Through this step the resist film obtained from the ionized radiation irradiation step is heated.

<Development Step>

The development step is a step of developing the resist film.

In the development step the polarity-changed areas of the resist film in the ionized radiation irradiation step are removed.

Development can be conducted using a developer, which is not particularly limited and can be appropriately selected depending on the intended purpose; however, water or an alkaline aqueous solution is suitable for the purpose of reducing environmental burdens.

The alkaline ingredient in the alkaline aqueous solution is not particularly limited and can be appropriately selected depending on the intended purpose; examples include inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium hydroxides such as tetramethylammonium hydroxide, tetraethylammonium hydroxide, triethylhydroxymethylammonium hydroxide and trimethylhydroxyethylammonium hydroxide. These compounds may be used singly or in combination.

Where necessary, a water-soluble organic solvent such as methyl alcohol, ethyl alcohol propyl alcohol or ethylene glycol, a surfactant, an agent for inhibiting resin dissolution, etc., can be added to the alkaline aqueous solution, and the same surfactant that can be added to the resist composition of the present invention can be added to the alkaline aqueous solution.

Through this step the polarity-changed areas of the resist film are removed to form (reveal) a resist pattern.

The cross sectional shapes of the resist space pattern in the resultant resist pattern, i.e., the cross sectional shapes of the openings between adjacent lines of the resist pattern, are preferably rectangular or tapered, with the taper angle being preferably 85° or more, more preferably 90° or more, for example.

A taper angle of less than 85° results in failure to make accurate measurements of the dimensions of the resist pattern when viewed from the top, which may make fine patterning difficult upon manufacture of a semiconductor device.

Since the resist pattern forming process of the present invention is capable of prevention of the formation of abnormal resist pattern shapes for efficient high-precision formation of finer, high-resolution resist patterns. Thus, the resist pattern forming process of the present invention can be suitably used in the manufacture of functional parts such as mask patterns, reticle patterns, magnetic heads, liquid crystal displays (LCDs), plasma display panels (PDPs) and surface acoustic wave filters (SAW filters); optical parts for optical interconnection; fine parts such as microactuators; and semiconductor devices, and can be employed most preferably in the method of the present invention for manufacturing a semiconductor device.

In the case where a resist pattern formed by means of the resist pattern forming process of the present invention is a mask pattern used as a mask, selective vapor deposition, selective etching, etc., using this mask results in the formation of a fine pattern which is made of metal and other materials and which has regularly spaced lines with a very small width, allowing manufacture of various types of semiconductor devices with such fine patterns. For example, it is made possible to readily manufacture a semiconductor device with interconnections of about 100 nm in width.

(Method for Manufacturing Semiconductor Device)

The method of the present invention for manufacturing a semiconductor device includes at least a resist pattern forming step and a patterning step, and where necessary, further includes additional step(s) selected appropriately.

<Resist Pattern Forming Step>

The resist pattern forming step is a step of forming a resist pattern on a work surface by means of the resist pattern forming process of the present invention. Through the resist pattern forming step a resist pattern is formed on a work surface.

The details of this resist pattern forming step are identical to those given for the resist pattern forming process of the present invention.

Note that although surface layers of various parts of a semiconductor device can be cited as examples of the work surface, specific suitable examples are substrates such as silicon wafers or the surface thereof and various oxide films. The details of the resist pattern are identical to those given above.

<Patterning Step>

The patterning step is a step in which the work surface is patterned by etching using the resist pattern formed as a mask or the like (i.e., as a mask pattern or the like).

The etching method is not particularly limited and can be appropriately selected from known methods depending on the intended use; dry etching is a suitable example. The etching conditions are not particularly limited and can be set depending on the intended purpose.

The method of the present invention for manufacturing a semiconductor device is capable of prevention of the formation of abnormal resist shapes for efficient, high-precision formation of fine, high-resolution resist patterns, and of efficient mass production of high-performance semiconductor devices with fine interconnection patterns formed using the resist pattern, such as flash memories, DRAMs, and FRAMs.

Hereinafter, the present invention will be described with reference to Examples, which however shall not be construed as limiting the invention thereto. Note that "part(s)" means "part(s) by mass" unless otherwise indicated.

As the constituent materials of the resist composition, the following materials were prepared:
(1) Base Resin
   1A . . . t-Boc protected poly(p-hydroxystyrene) (30% by mass, Mw=11,000)
   1B . . . Mevalonic lactone methacrylate/2-adamantyl methacrylate copolymer (1:1) (Mw=10,000)
(2) Photoacid Generator
   2A . . . Triphenylsulfonium trifluoromethanesufonate
(3) Solvent
   3A . . . Propyleneglycol monomethyletheracetate
(4) Additives
   4A Formic acid
   4B . . . Lactic acid
   4C . . . Acetic acid
   4D . . . Ethylenediamine
   4E . . . Hexylamine
   4F . . . Pentylamine Table 1 lists pKa's and vapor pressures (at 100° C.) of these additives.

TABLE 1

| Type | pKa | Vapor pressure at 100° C. (kPa (Torr)) |
|---|---|---|
| 4A | 3.54 | 99.63 (747.4) |
| 4B | 4.57 | 9.56 (71.7) |
| 4C | 4.76 | 56.89 (426.8) |
| 4D | 7.12 | 58.32 (437.5) |
| 4E | 10.85 | 36.23 (271.8) |
| 4F | 10.93 | 88.43 (663.4) |

Examples 1 to 9

—Preparation of Positive-Type Resist Compositions—

Positive-type resist compositions were prepared by combining 100 parts of Base Resin 1A, 5 parts of Photoacid Generator 2A, 600 parts of Solvent 4A, and certain amounts of different combinations of two or three additives (i.e., a combination of first and second additives, or a combination of first second and third additives) selected from Additives 4A to 4F in terms of the mole proportion with respect to Photoacid Generator 2A, as shown in Table 2.

—Formation of Resist Pattern—

Each of the positive-type resist compositions prepared above was applied over a Si substrate to a thickness of 450 nm by spin coating (condition: 2,500 rpm, 60 seconds), followed by baking at 100° C. (resist formation temperature) for 90 seconds. This is the resist film forming step described above.

Subsequently, using an electron beam exposure device, the resist film was exposed to ionized radiation at an accelerating voltage of 50 keV to form latent lines of 0.08 μm width over the resist film surface. This is the ionized radiation irradiation step described above.

The resist film was then baked at 100° C. for 90 seconds (Post Exposure Bake (PEB)). This is the heating step described above.

Development was conducted for 60 seconds using a 2.38% (by mass) aqueous solution of tetramethylammoniumhydroxide (TMAH). This is the development step described above.

As a result, electron beam-irradiated areas of the resist film were removed, thereby forming a resist pattern.

The cross sections of the resultant resist patterns were observed using a scanning electron microscope (SEM), and the taper angle θ of the opening 4 between adjacent lines of the resist pattern 3, i.e., the cross section of the resist space pattern, was measured as shown in FIG. 1C. The measurement results are shown in Table 2.

Comparative Examples 1 to 11

Resist compositions were prepared and resist patterns were formed in the same manner as those in Example 1, with the combinations of two additives (first and second additives) changed to those shown in Table 2. The cross sections of the resultant resist patterns were observed using the scanning electron microscope (SEM) to measure the taper angle θ (see FIG. 1C). The measurement results are shown in Table 2.

Example 10

A resist composition was prepared and a resist pattern was formed in the same manner as those in Example 1, with Base Resin 1A changed to Base Resin 1B and with Additives 4C and 4E added in certain amounts in terms of the mole proportion with respect to Photoacid Generator 2A. The cross section of the resultant resist pattern was observed using the scanning electron microscope (SEM) to measure the taper angle θ of the opening present between adjacent lines of the resist pattern, i.e., cross section of the resist space pattern (see FIG. 1C). The measurement results are shown in Table 3.

Comparative Examples 12 to 14

Resist compositions were prepared and resist patterns were formed in the same manner as those in Example 10, with

TABLE 2

|  | First additive | | Second additive | | Third additive | | Taper angle θ(°) |
|---|---|---|---|---|---|---|---|
|  | Type | Content (mol %) | Type | Content (mol %) | Type | Content (mol %) |  |
| Ex. 1 | 4A | 10 | 4B | 5 | — | — | 85 |
| Ex. 2 | 4A | 10 | 4E | 5 | — | — | 86 |
| Ex. 3 | 4C | 5 | 4E | 5 | — | — | 99 |
| Ex. 4 | 4D | 5 | 4E | 5 | — | — | 94 |
| Ex. 5 | 4D | 0.5 | 4E | 9.5 | — | — | 86 |
| Ex. 6 | 4D | 1 | 4E | 9 | — | — | 91 |
| Ex. 7 | 4D | 9 | 4E | 1 | — | — | 90 |
| Ex. 8 | 4D | 9.5 | 4E | 0.5 | — | — | 87 |
| Ex. 9 | 4A | 3.3 | 4D | 3.3 | 4E | 3.3 | 97 |
| Compara. Ex. 1 | — | — | — | — | — | — | 76 |
| Compara. Ex. 2 | 4A | 10 | — | — | — | — | 81 |
| Compara. Ex. 3 | 4B | 10 | — | — | — | — | 78 |
| Compara. Ex. 4 | 4C | 10 | — | — | — | — | 76 |
| Compara. Ex. 5 | 4D | 10 | — | — | — | — | 79 |
| Compara. Ex. 6 | 4E | 10 | — | — | — | — | 82 |
| Compara. Ex. 7 | 4F | 10 | — | — | — | — | 81 |
| Compara. Ex. 8 | 4B | 5 | 4C | 5 | — | — | 83 |
| Compara. Ex. 9 | 4C | 5 | 4D | 5 | — | — | 80 |
| Compara. Ex. 10 | 4D | 5 | 4F | 5 | — | — | 72 |
| Compara. Ex. 11 | 4E | 5 | 4F | 5 | — | — | 81 |

From the results shown in Table 2, it was established that the use of the positive-type resist compositions prepared in Examples 1 to 8, each of which comprises a first additive and a second additive whose pKa is higher than that of the first additive and whose vapor pressure at the resist formation temperature is lower than that of the first additive, resulted in the formation of resist patterns wherein the cross sectional shapes of the openings between adjacent lines of the resist pattern, i.e., the cross sectional shapes of the resist space pattern, are rectangular or forward tapered.

Moreover, it was established that the use of the positive-type resist composition prepared in Example 9, which in addition to the first and second additives comprises a third additive whose pKa is higher than that of the second additive and whose vapor pressure at the resist formation temperature is lower than that of the second additive, resulted in the formation of a resist pattern with openings that are excellent in their cross sectional shapes.

It was established that in the resist patterns obtained in Comparative Examples 1 to 11, the cross sectional shapes of the openings of the resultant resist patterns were, on the other hand, reverse tapered, thus resulting in poor precision in the dimension measurement of the resist pattern when viewed from the top.

neither Additives 4C nor 4D added or either Additive 4C or Additive 4D added. The cross sections of the resultant resist patterns were observed using the scanning electron microscope (SEM) to measure the taper angle θ of the opening present between adjacent lines of the resist patterns, i.e., cross section of the resist space pattern (see FIG. 1C). The measurement results are shown in Table 3.

TABLE 3

|  | First additive | | Second additive | | Tapr angle θ (°) |
|---|---|---|---|---|---|
|  | TYpe | Content (mol %) | Type | Content (mol %) |  |
| Ex. 10 | 4C | 5 | 4E | 5 | 94 |
| Compara. Ex. 12 | — | — | — | — | 83 |
| Compara. Ex. 13 | 4C | 10 | — | — | 84 |
| Compara. Ex. 14 | 4E | 10 | — | — | 80 |

From the results shown in Table 3, it was established that the use of the positive-type resist composition prepared in Example 10, which comprises a first additive and a second additive whose pKa is higher than that of the first additive and whose vapor pressure at the resist formation temperature is lower than that of the first additive, resulted in the formation of a resist pattern wherein the cross sectional shapes of the openings between adjacent lines of the resist pattern, i.e., the cross sectional shapes of the resist space pattern, are forward tapered. It was established that in the resist patterns obtained in Comparative Examples 12 to 14, the cross sectional shapes of the openings of the resultant resist patterns were, on the other hand, reverse tapered, thus resulting in poor precision in the dimension measurement of the resist pattern when viewed from the top.

Example 11

—Flash Memory and its Manufacture—

Example 11 illustrates an example of the method of the present invention for manufacturing an electronic device, which the method uses the resist composition of the present invention. Note in Example 11 that the resist films 26, 27, 29, and 32 described below are ones prepared in the same manner as that in Example 4 where the resist composition of Example 4 was used.

Figure 2:
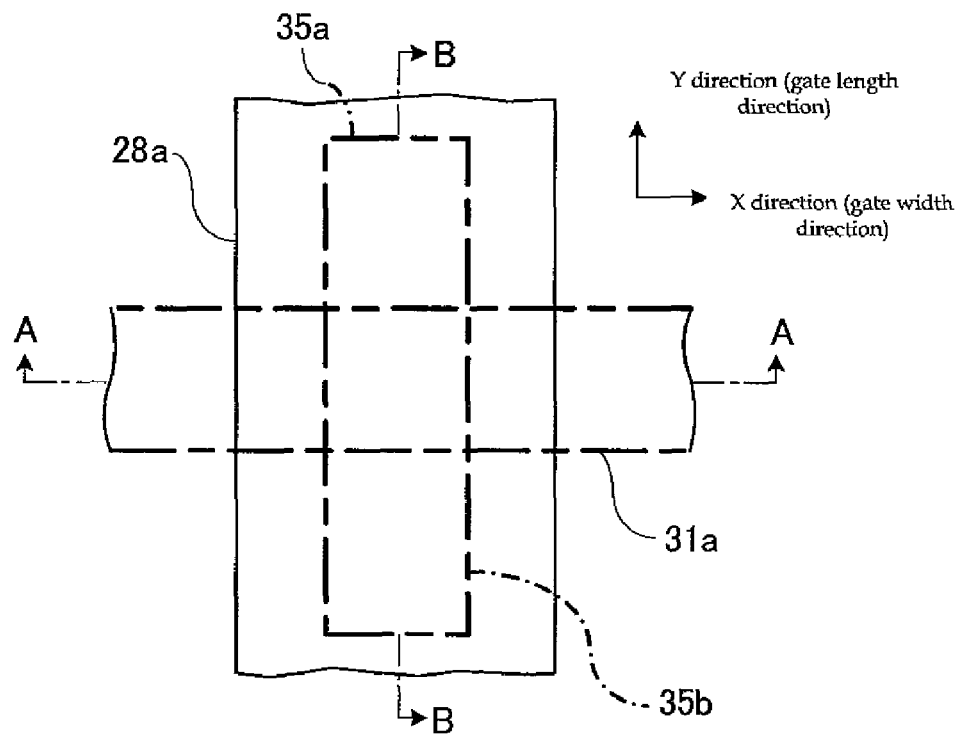
FIG. 2 is a plan view showing a first example of a FLASH EPROM manufactured using the method of the present invention for manufacturing a semiconductor device.
Figure 3:
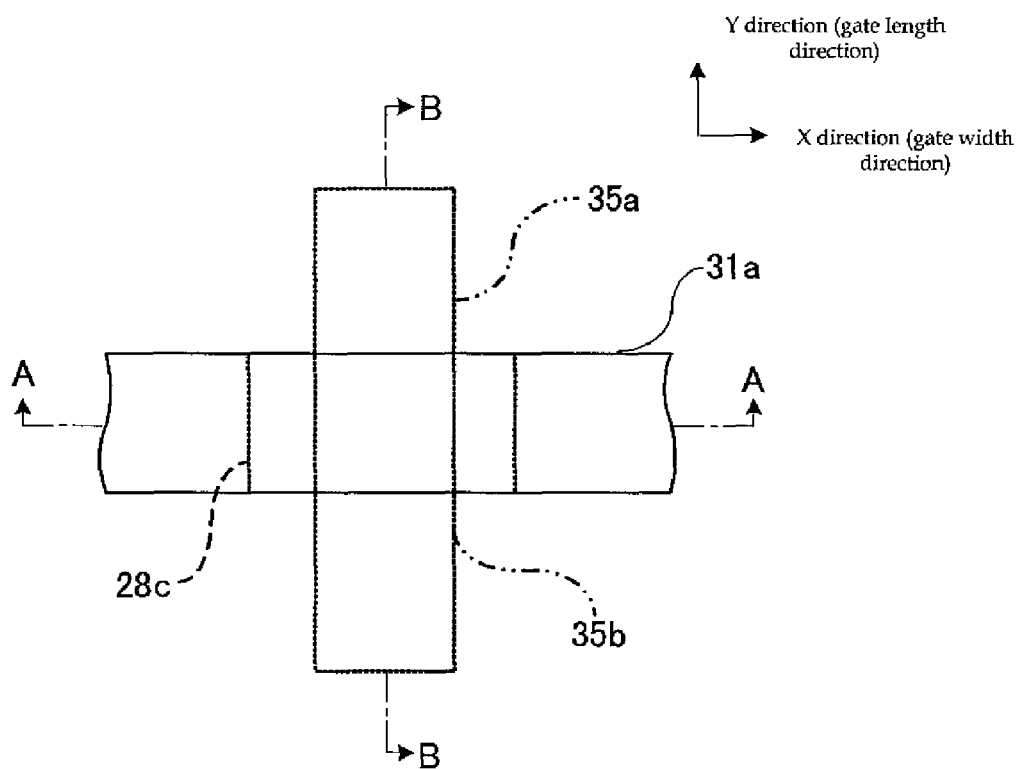
FIG. 3 is another plan view showing a first example of a FLASH EPROM manufactured using the method of the present invention for manufacturing a semiconductor device.

FIGS. 2 and 3 are each a top (plan) view of a FLASH EPROM called FLOTOX type or ETOX type. FIGS. 4 to 12 are schematic sectional views for explaining an example of the method of manufacturing the FLASH EPROM. The left view in each of FIGS. 4 to 12 illustrates a memory cell part (first element region), showing a schematic sectional view of a portion to be provided with a MOS transistor having a floating gate electrode, the schematic sectional view being taken along the A-A line of the gate width direction (X direction in FIGS. 2 and 3); the central view illustrates the memory cell part corresponding to that shown in the left view, showing a schematic sectional view taken along the B-B line of the gate length direction (Y direction in FIGS. 2 and 3) that is orthogonal to the X direction; and the right view is a schematic sectional view of a portion of a peripheral circuitry part (second element region) to be provided with a MOS transistor, the schematic sectional view being taken along the A-A line in FIGS. 2 and 3.

Figure 4:
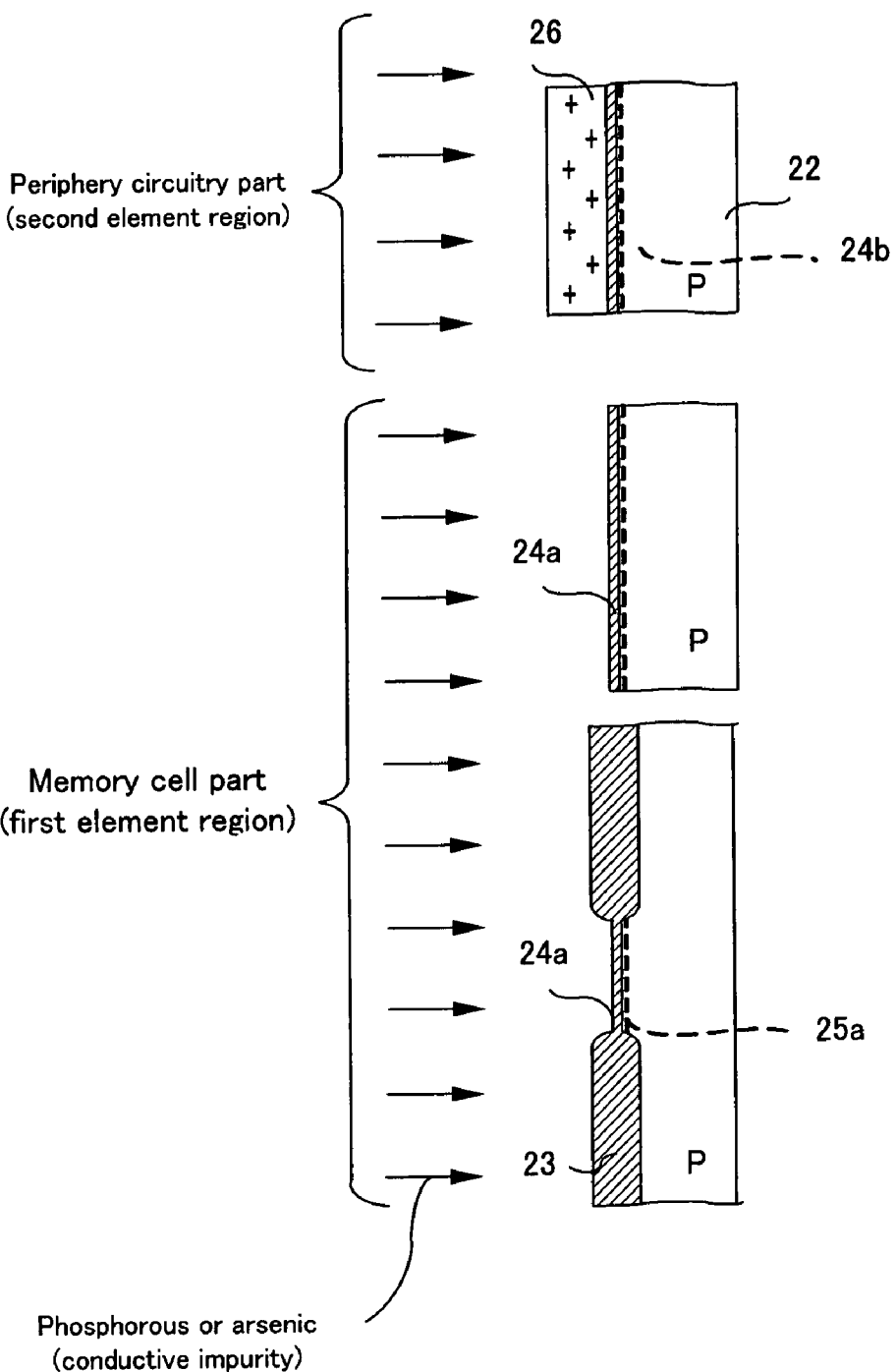
FIG. 4 is a schematic explanatory diagram of a first example of the manufacture of a FLASH EPROM by using the method of the present invention for manufacturing a semiconductor device.
Figure 5:
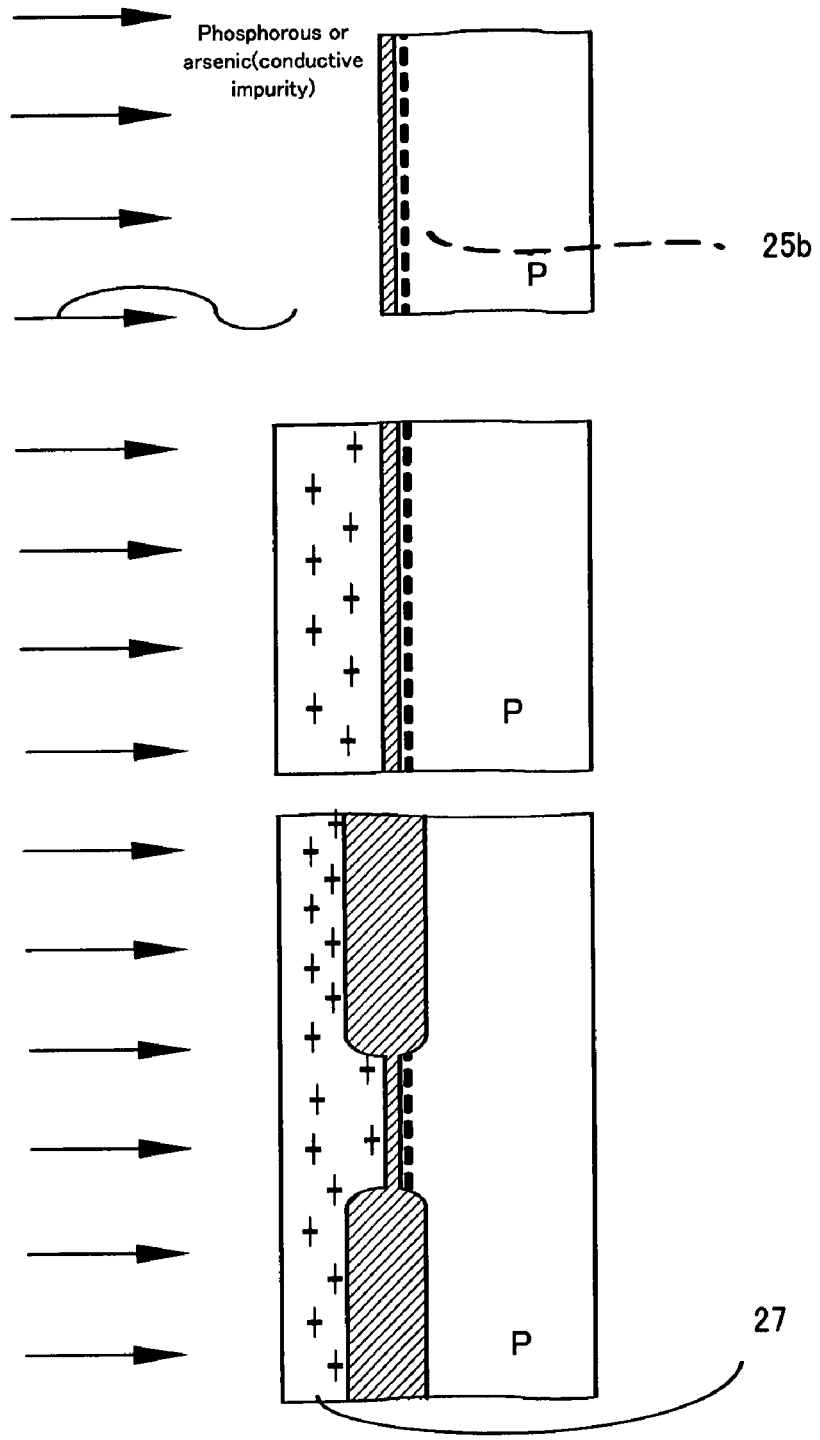
FIG. 5 is a schematic explanatory diagram of a first example of the manufacture of a FLASH EPROM by using the method of the present invention for manufacturing a semiconductor device, showing a step conducted after the step shown in FIG. 4.
Figure 6:
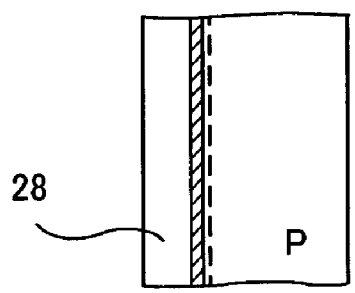
FIG. 6 is a schematic explanatory diagram of a first example of the manufacture of a FLASH EPROM by using the method of the present invention for manufacturing a semiconductor device, showing a step conducted after the step shown in FIG. 5.
Figure 6:
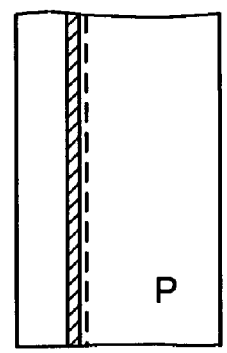
Figure 6:
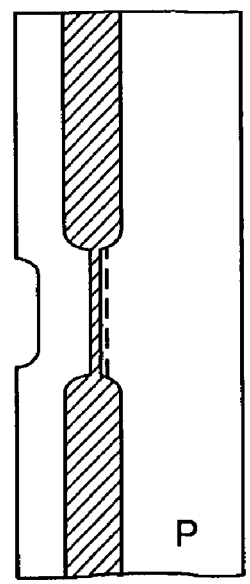

Firstly, as shown in FIG. 4, a field oxide film 23 formed of a $SiO_2$ film was formed on the selected portions of the element separation region of a p-type Si substrate 22. Thereafter, a $SiO_2$ film was formed by thermal oxidation in the MOS transistor in the memory cell part (first element region) to form a first gate insulating film 24a of 100 Å to 300 Å (10 nm to 30 nm) thickness. In another step a $SiO_2$ film was formed by thermal oxidation in the MOS transistor present in the periphery circuitry part (second element region) to form a second gate insulating film 24b of 100 Å to 500 Å (10 nm to 50 nm) thickness. In a case where the first and second gate insulating films 24a and 24b are to have the same thickness, the oxide films may be formed simultaneously in the same step.

In order to form a MOS transistor with an n-type depletion channel in the memory cell part (the left and center views of FIG. 16), the periphery circuitry part (the right view of FIG. 4) was masked with a resist film 26 so as to control the threshold voltage. The region to be a channel region directly under a floating gate electrode was doped with phosphorous (P) or arsenic (As) as an n-type impurity at a dose amount of $1 \times 10^{11}$ $cm^{-2}$ to $1 \times 10^{14}$ $cm^{-2}$ by means of ion implantation, forming a first threshold controlling layer 25a. Note that the doping concentration and the conductivity type of the impurity can be appropriately determined according to the channel type—depletion type or accumulation type.

In order to form a MOS transistor with an n-type depletion channel in the periphery circuitry part (the right view of FIG. 5), the memory cell part (the left and center views of FIG. 5) was masked with a resist film 27 so as to control the threshold voltage. The region to be a channel region directly under the floating gate electrode was doped with phosphorous (P) or arsenic (As) as an n-type impurity at a dose amount of $1 \times 10^{11}$ $cm^{-2}$ to $1 \times 10^{14}$ $cm^2$ by means of ion implantation, forming a second threshold controlling layer 25b.

A first polysilicon film (first conductive film) 28 of 500 Å to 2,000 Å (50 nm to 200 nm) thickness was formed over both the memory cell part (the left and center views of FIG. 6) and the periphery circuitry part (the right view of FIG. 6) so as to serve as a floating gate electrode of the MOS transistor in the memory cell part and as a gate electrode of the MOS transistor in the periphery circuitry part.

Figure 7:
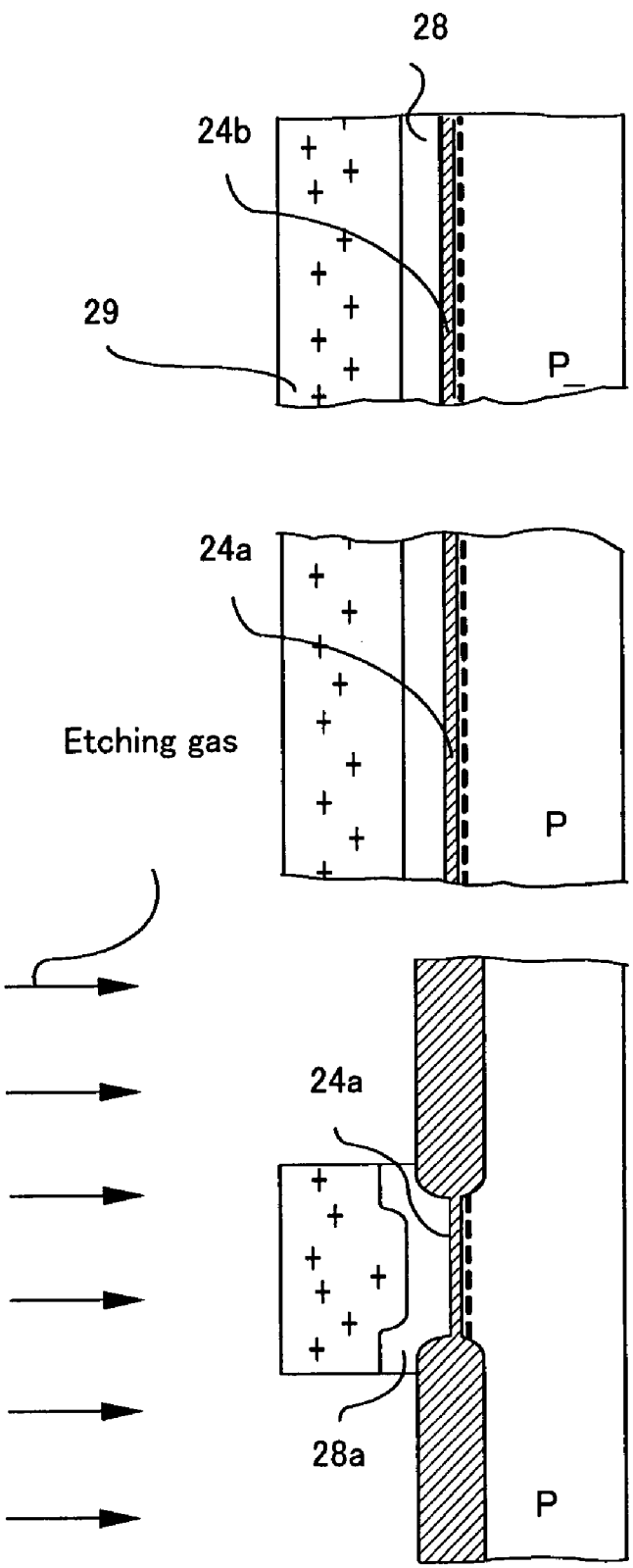
FIG. 7 is a schematic explanatory diagram of a first example of the manufacture of a FLASH EPROM by using the method of the present invention for manufacturing a semiconductor device, showing a step conducted after the step shown in FIG. 6.

Subsequently, as shown in FIG. 7, the first polysilicon film 28 was patterned using a resist film 29 as a mask to form a floating gate electrode 28a of the MOS transistor in the memory cell part (the left and center views of FIG. 7). At this point, as shown in FIG. 7, the first polysilicon film 28 was patterned in such a manner that the final dimension of the floating gate electrode 28a is defined only in X direction, with the dimension in Y direction left undetermined and with the region to be an S/D region left covered with the resist film 29.

Figure 8:
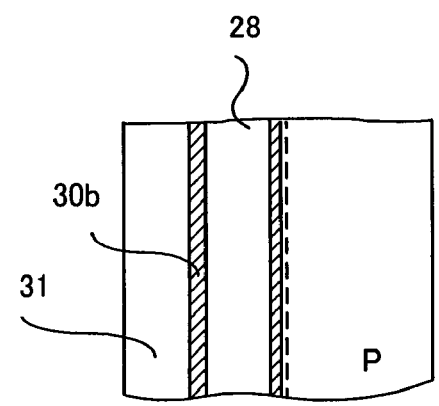
FIG. 8 is a schematic explanatory diagram of a first example of the manufacture of a FLASH EPROM by using the method of the present invention for manufacturing a semiconductor device, showing a step conducted after the step shown in FIG. 7.
Figure 8:
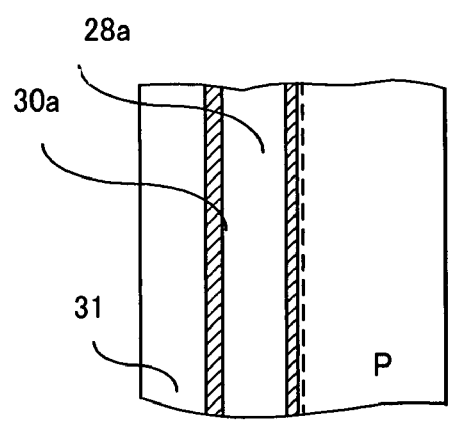
Figure 8:
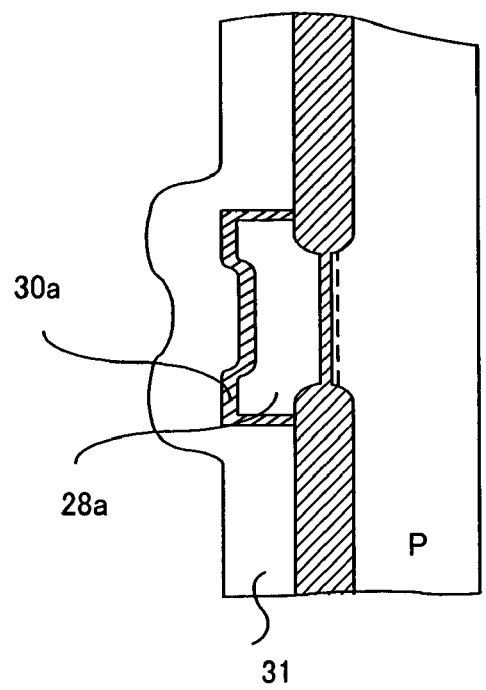
Figure 9:
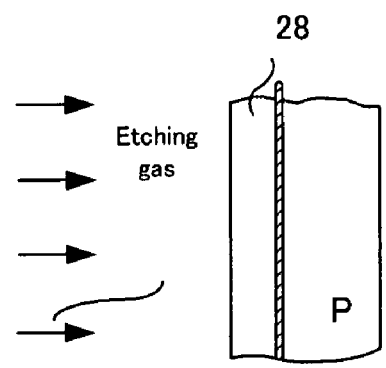
FIG. 9 is a schematic explanatory diagram of a first example of the manufacture of a FLASH EPROM by using the method of the present invention for manufacturing a semiconductor device, showing a step conducted after the step shown in FIG. 8.
Figure 9:
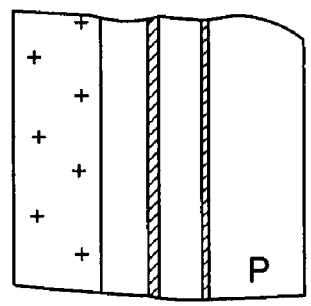
Figure 9:
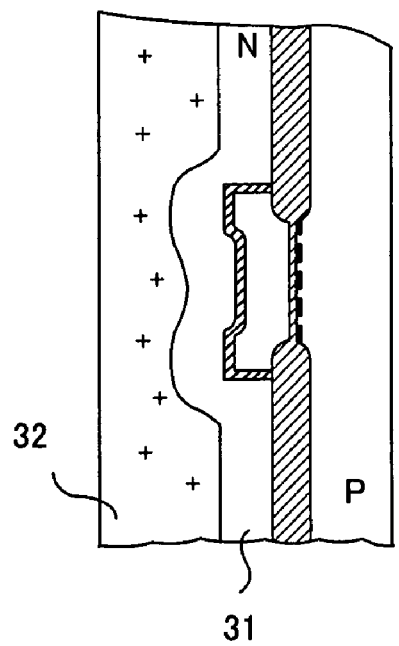

Next, as shown in the left and central views of FIG. 8, the resist film 29 was removed and then a capacitor insulating film 30a formed of a $SiO_2$ film of about 200 Å to 500 Å (20 nm to 50 nm) thickness was formed by thermal oxidation so as to cover the floating gate electrode 28a. At this point, a capacitor insulating film 30b formed of a $SiO_2$ film was formed also on the first polysilicon film 28 in the periphery circuitry part (the right view of FIG. 8). Although both the capacitor insulating films 30a and 30b were formed only of a $SiO_2$ film in this particular case, they may be formed of a composite film having two or three $SiO_2$ film(s) and/or $Si_3N_4$ film(s) stacked on top of each other.

As shown in FIG. 8, a second polysilicon film (second conductive film) 31 of 500 Å to 2,000 Å (50 nm to 200 nm) thickness, which would constitute a control gate electrode, was formed so as to cover the floating gate electrode 28a and the capacitor insulating film 30a.

Figure 10:
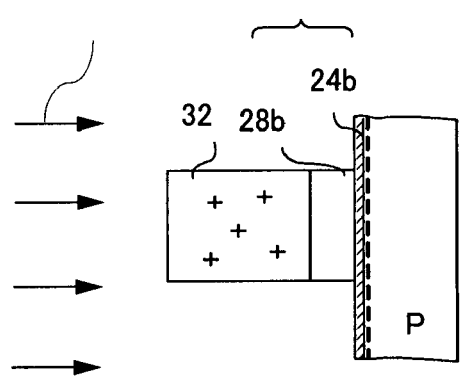
FIG. 10 is a schematic explanatory diagram of a first example of the manufacture of a FLASH EPROM by using the method of the present invention for manufacturing a semiconductor device, showing a step conducted after the step shown in FIG. 9.
Figure 10:
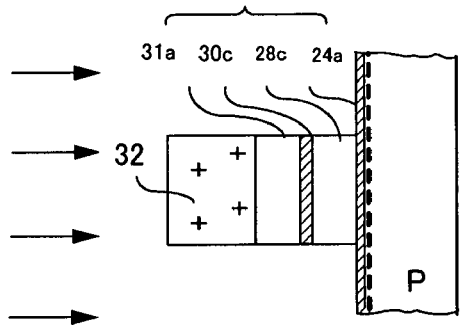
Figure 10:
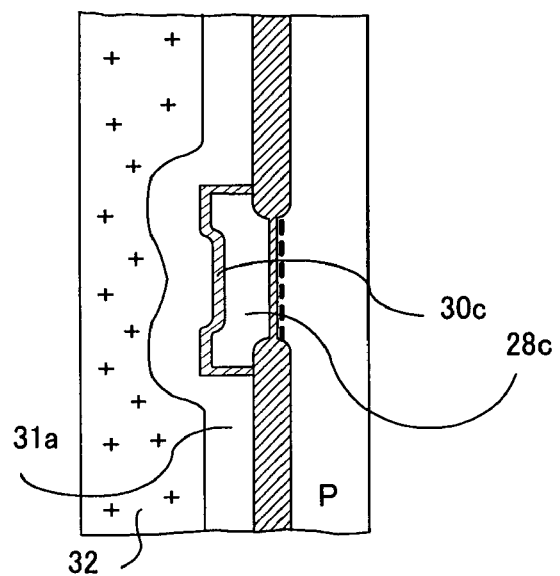
Figure 11:
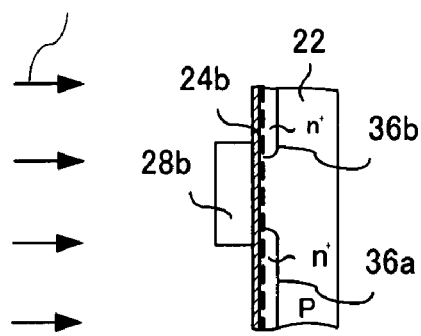
FIG. 11 is a schematic explanatory diagram of a first example of the manufacture of a FLASH EPROM by using the method of the present invention for manufacturing a semiconductor device, showing a step conducted after the step shown in FIG. 10.
Figure 11:
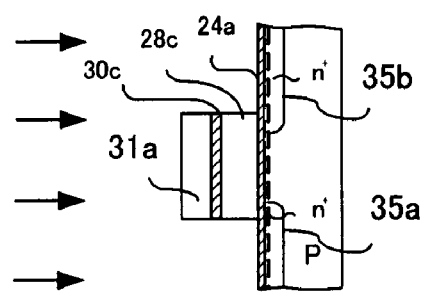
Figure 11:
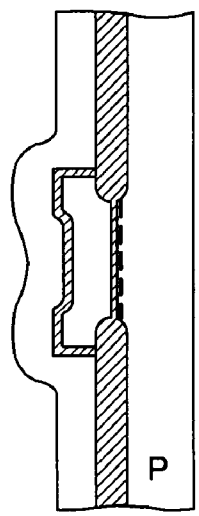

The memory cell part (left and center views of FIG. 9) was then masked with a resist film 32 as shown in FIG. 10, and the second polysilicon film 31 and the capacitor insulating film 30b in the periphery circuitry part (the right view of FIG. 9) were sequentially etched away, revealing the first polysilicon film 28.

Next, as shown in FIG. 10, the second polysilicon film 31, the capacitor insulating film 30a and the first polysilicon film 28a patterned in such a manner that the final dimension of the first polysilicon film 28a is defined only in X direction, all of which are arranged in the memory cell part (the center and left views of FIG. 10), were masked with a resist film 32 and patterned so as to define the final dimension of a first gate part 33a in Y direction, forming a laminate that is about 1 μm in Y direction and composed of a control gate electrode 31a, a capacitor insulating film 30c and a floating gate electrode 28c. At the same time, the first polysilicon film 28 in the periphery circuitry part (right view of FIG. 10) was masked with the resist film 32 and patterned so as to define a final dimension of a second gate part 33b, forming a gate electrode 28b of about 1 μm in width.

Using as a mask the laminate that is provided in the memory cell part (left and center views of FIG. 11) and composed of the control gate electrode 31a, capacitor insulating film 30c and floating gate electrode 28c, the Si substrate 22 was doped with phosphorous (P) or arsenic (As) at a dose amount of $1 \times 10^{14}$ $cm^{-2}$ to $1 \times 10^{16}$ $cm^2$ by means of ion implantation, forming n-type S/D region layers 35a and 35b in element formation regions. At the same time, using as a mask the gate electrode 28b in the periphery circuitry part (right view of FIG. 11), the Si substrate 22 was doped with phosphorous (P) or arsenic (As) as an n-type impurity at a dose amount of $1 \times 10^{14}$ cm$^{-2}$ to $1 \times 10^{16}$ cm$^{-2}$ by means of ion implantation, forming S/D region layers 36a and 36b in element formation regions.

Figure 12:
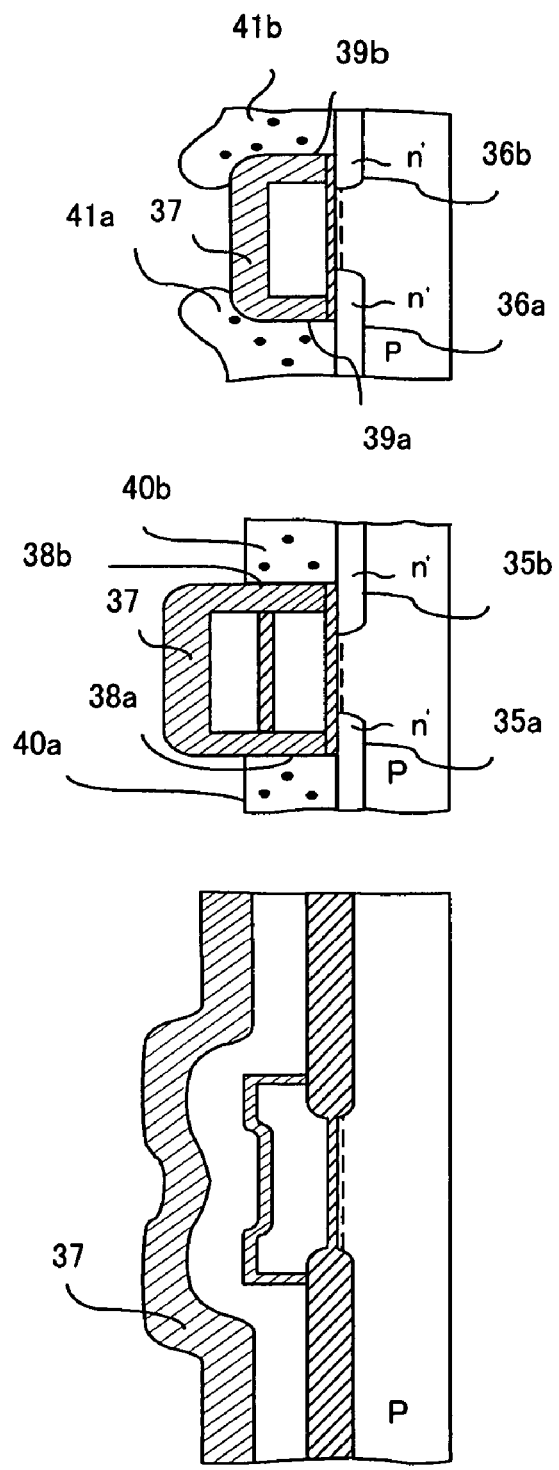
FIG. 12 is a schematic explanatory diagram of a first example of the manufacture of a FLASH EPROM by using the method of the present invention for manufacturing a semiconductor device, showing a step conducted after the step shown in FIG. 11.

An interlayer insulating film 37 formed of a PSG film of about 5,000 Å (500 nm) thickness was formed so as to cover the first gate part 33a in the memory cell part (the left and center views of FIG. 12) and the second gate part 33b in the periphery circuitry part (the right view of FIG. 12)

In the interlayer insulating film 37 formed over the S/D region layers 35a and 35b and the S/D region layers 36a and 36b, contact holes 38a and 38b and contact holes 39a and 39b were respectively formed, followed by formation of S/D electrodes 40a and 40b and S/D electrodes 41a and 41b therein. Note that the contact holes 38a and 38b and the contact holes 39a and 39b were formed in accordance with a general method, after formation of a hole pattern by means of the resist composition of the present invention.

In this way a FLASH EPROM was manufactured as a semiconductor device as shown in FIG. 12.

During the manufacture of this FLASH EPROM, the second gate insulating film 24b in the periphery circuitry part (the right views of FIGS. 4 to 12) is kept covered with either the first polysilicon film 28 or the gate electrode 28b from the time of its formation (as shown in the right views of FIGS. 4 to 12). For this reason, the thickness of the second gate insulating film 24b remains unchanged from its formation, allowing easy control of the thickness of the second gate insulating film 24b and easy adjustment of the concentration of conductive impurities for threshold voltage control.

In Examples described above, although patterning was conducted in such a manner that the first gate part 33a is first defined in the gate width direction (X direction shown in FIGS. 2 and 3) to a certain dimension and then the gate length direction (Y direction shown in FIGS. 2 and 3) is defined for forming the first gate part 33a, this may be conducted in reverse order; patterning may be conducted in such a manner that the first gate part 33a is first defined in the gate length direction to a certain dimension and then the final dimension of the first gate part 33a is defined in the gate width direction for forming the first gate part 33a.

Figure 13:
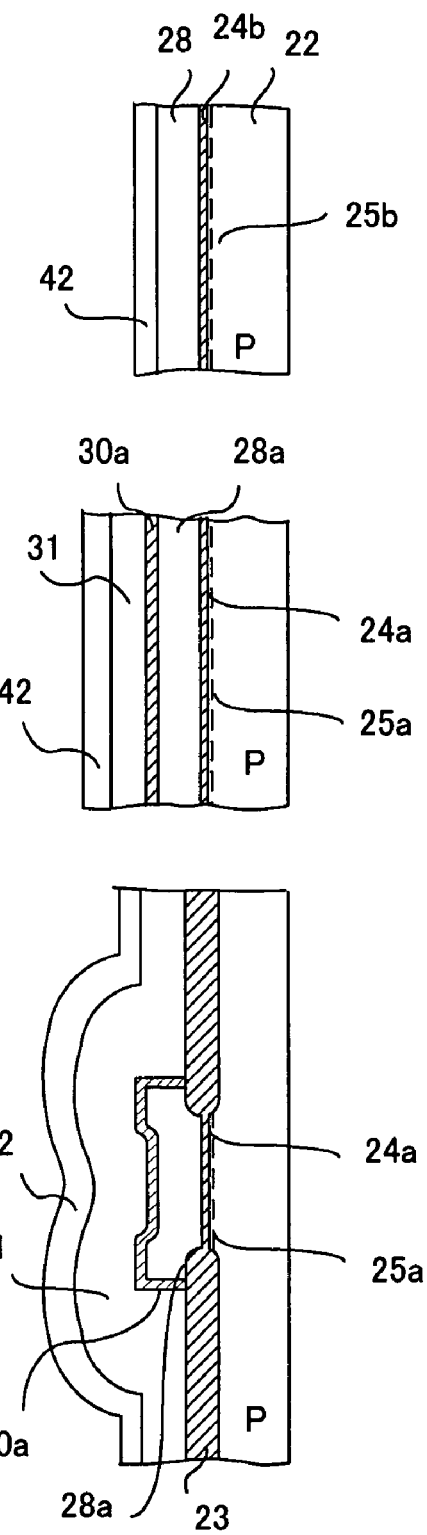
FIG. 13 is a schematic explanatory diagram of a second example of the manufacture of a FLASH EPROM by using the method of the present invention for manufacturing a semiconductor device.
Figure 14:
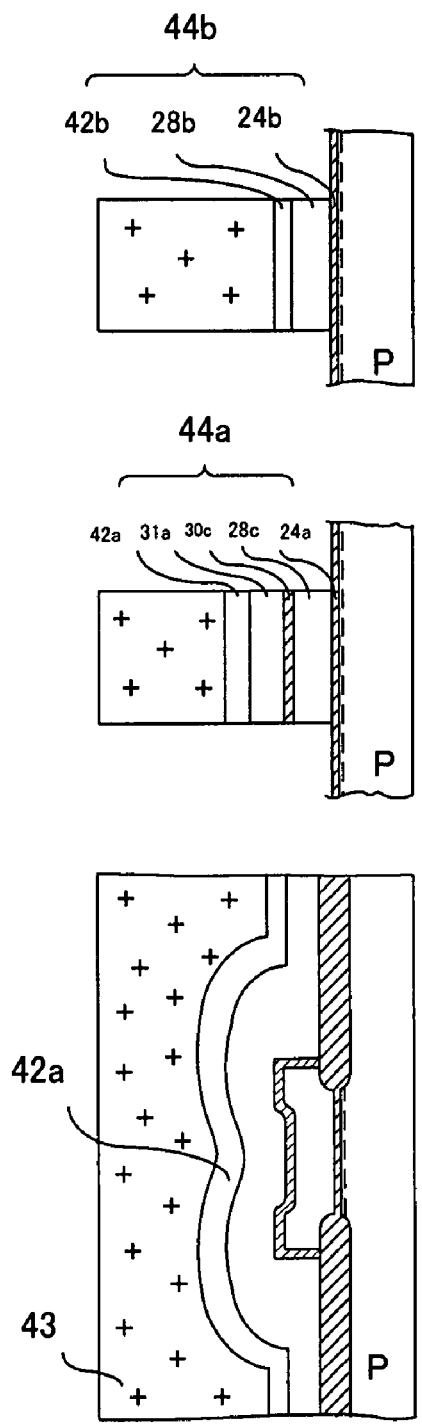
FIG. 14 is a schematic explanatory diagram of a second example of the manufacture of a FLASH EPROM by using the method of the present invention for manufacturing a semiconductor device, showing a step conducted after the step shown in FIG. 13.
Figure 15:
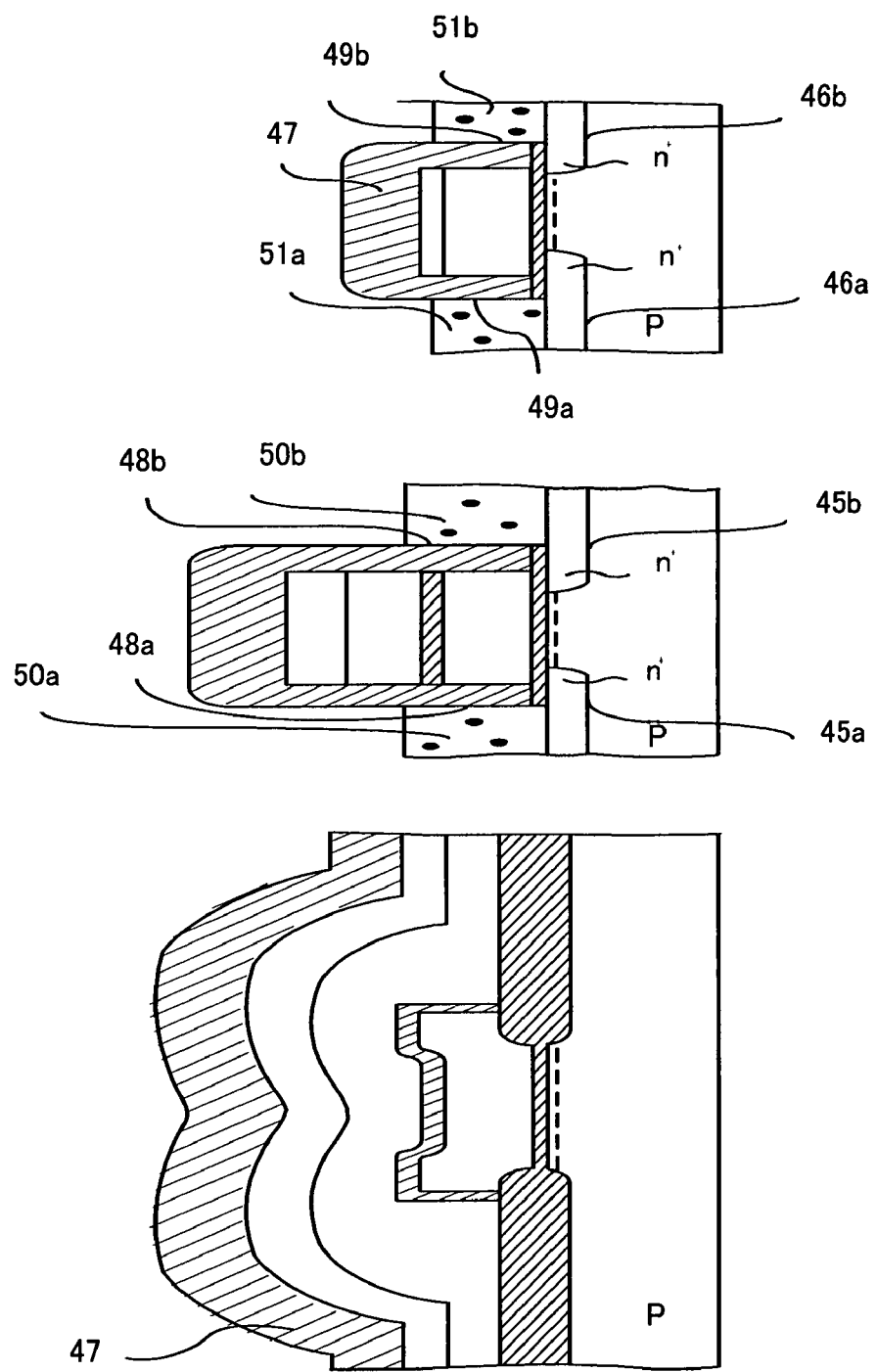
FIG. 15 is a schematic explanatory diagram of a second example of the manufacture of a FLASH EPROM by using the method of the present invention for manufacturing a semiconductor device, showing a step conducted after the step shown in FIG. 14.

An example of manufacture of a FLASH EPROM shown in FIGS. 13 to 15 is similar to that described in Examples above except that the steps subsequent to the step corresponding to FIG. 12 were changed to those shown in FIG. 13 to 15. To be more specific, the example of manufacture of a FLASH EPROM shown in FIGS. 13 to 15 differs from Examples described above in that, as shown in FIG. 12, a high-melting point metal film (fourth conductive film) 42 of about 2,000 Å (200 nm) in thickness formed of a tungsten (W) film or titanium (Ti) film is formed over the second polysilicon film 31 in the memory cell part (the left and center views of FIG. 12) and over the first polysilicon film 28 in the periphery circuitry part (the right view of FIG. 12) to provide a polycide film. The steps after FIG. 13—the steps shown in FIGS. 14 and 15—are similar to those shown in FIGS. 10 to 12. Descriptions for the steps that are similar to those shown in FIGS. 10 and 12 are omitted, and members in FIGS. 13 and 15 that are identical to those shown in FIGS. 10 and 12 are given the same reference numerals.

In this way a FLASH EPROM was manufactured as a semiconductor device as shown in FIG. 15.

Because this FLASH EPROM includes high-melting point metal films (fourth conductive films) 42a and 42b respectively provided on the control gate electrode 31a and the gate electrode 28b, the electrical resistance can be further reduced. Although the high-melting point metal films (fourth conductive films) 42a and 42b were used, high-melting point metal silicide films such as titanium silicide (TiSi) films may be used.

Figure 16:
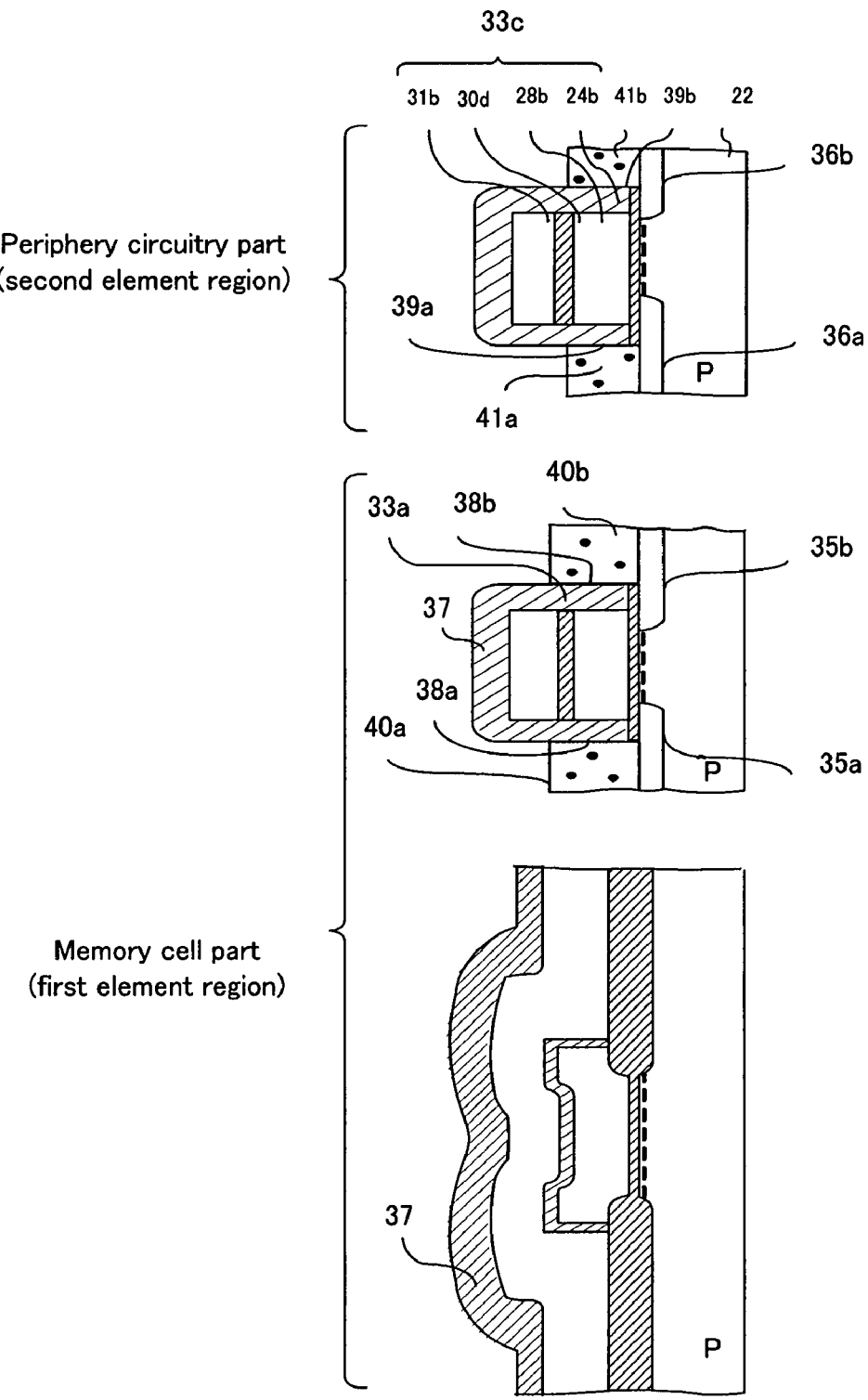
FIG. 16 is a schematic explanatory diagram of a third example of the manufacture of a FLASH EPROM by using the method of the present invention for manufacturing a semiconductor device.
Figure 17:
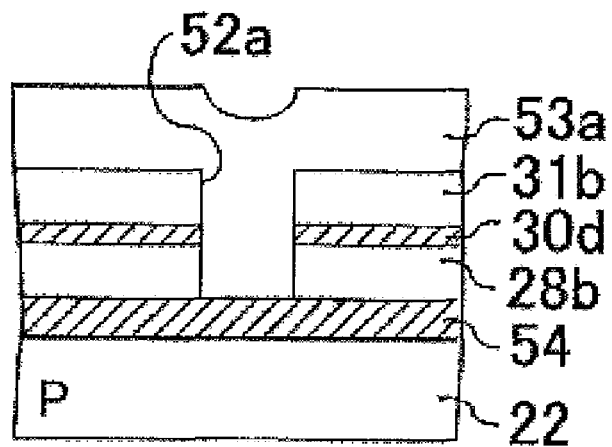
FIG. 17 is a schematic explanatory diagram of a third example of the manufacture of a FLASH EPROM by using the method of the present invention for manufacturing a semiconductor device, showing a step conducted after the step shown in FIG. 16.
Figure 18:
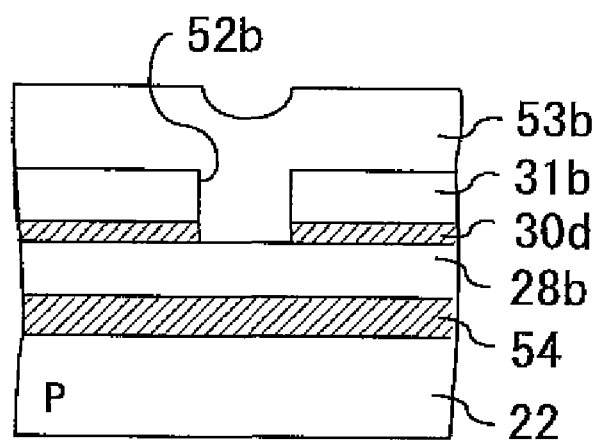
FIG. 18 is a schematic explanatory diagram of a third example of the manufacture of a FLASH EPROM by using the method of the present invention for manufacturing a semiconductor device, showing a step conducted after the step shown in FIG. 17.

An example of manufacture of a FLASH EPROM shown in FIGS. 16 to 18 is similar to that described in Examples described above except that a second gate part 33c in the periphery circuitry part (second element region in the right view of FIG. 16) is a laminate composed of a first polysilicon film 28b (first conductive film), a SiO$_2$ film 30d (capacitor insulating film) and a second polysilicon film 31b (second conductive film), a configuration similar to that of the first gate part 33a in the memory cell part (first element region in the left and center views of FIG. 16), and that the first and second polysilicon films 28b and 31b are electrically shorted to form a gate electrode as shown in FIGS. 17 and 18.

Here, as shown in FIG. 17, an opening 52a that penetrates through the first polysilicon film 28b (first conductive film), the SiO$_2$ film 30d (capacitor insulating film) and the second polysilicon film 31b (second conductive film) is formed at a position other than the second gate part 33c shown in FIG. 16, e.g., over an insulating film 54. Subsequently, a high-melting point metal film 53a (third conductive film) formed for instance of a W film or Ti film is embedded in the opening 52a to allow the first and second polysilicon films 28b and 31b to be electrically shorted. Moreover, as shown in FIG. 18, an opening 52b that penetrates through the SiO$_2$ film 30d (capacitor insulating film) and the second polysilicon film 31b (second conductive film) is formed, revealing the first polysilicon film 28b at the bottom of the opening 52b. Thereafter, a high-melting point metal film 53b (third conductive film) formed for instance of a W film or Ti film is embedded in the opening 52b to allow the first and second polysilicon films 28b and 31b to be electrically shorted.

In this FLASH EPROM, the second gate part 33c in the periphery circuitry part has the same structure as the first gate part 33a in the memory cell part. It is thus possible to form the periphery circuitry part together with the memory cell part, achieving simplification of the manufacturing process for greater efficiency.

Although the third conductive film 53a or 53b and the high-melting point metal film (fourth conductive film) 42 were formed in separate steps herein, they may be formed at the same time as a common high-melting point metal film.

Example 12

—Magnetic Head and its Manufacture—

Example 12 relates to a manufacture of a composite magnetic head, an example of application in which a resist pattern formed using the resist composition of the present invention is used.

Figure 19:
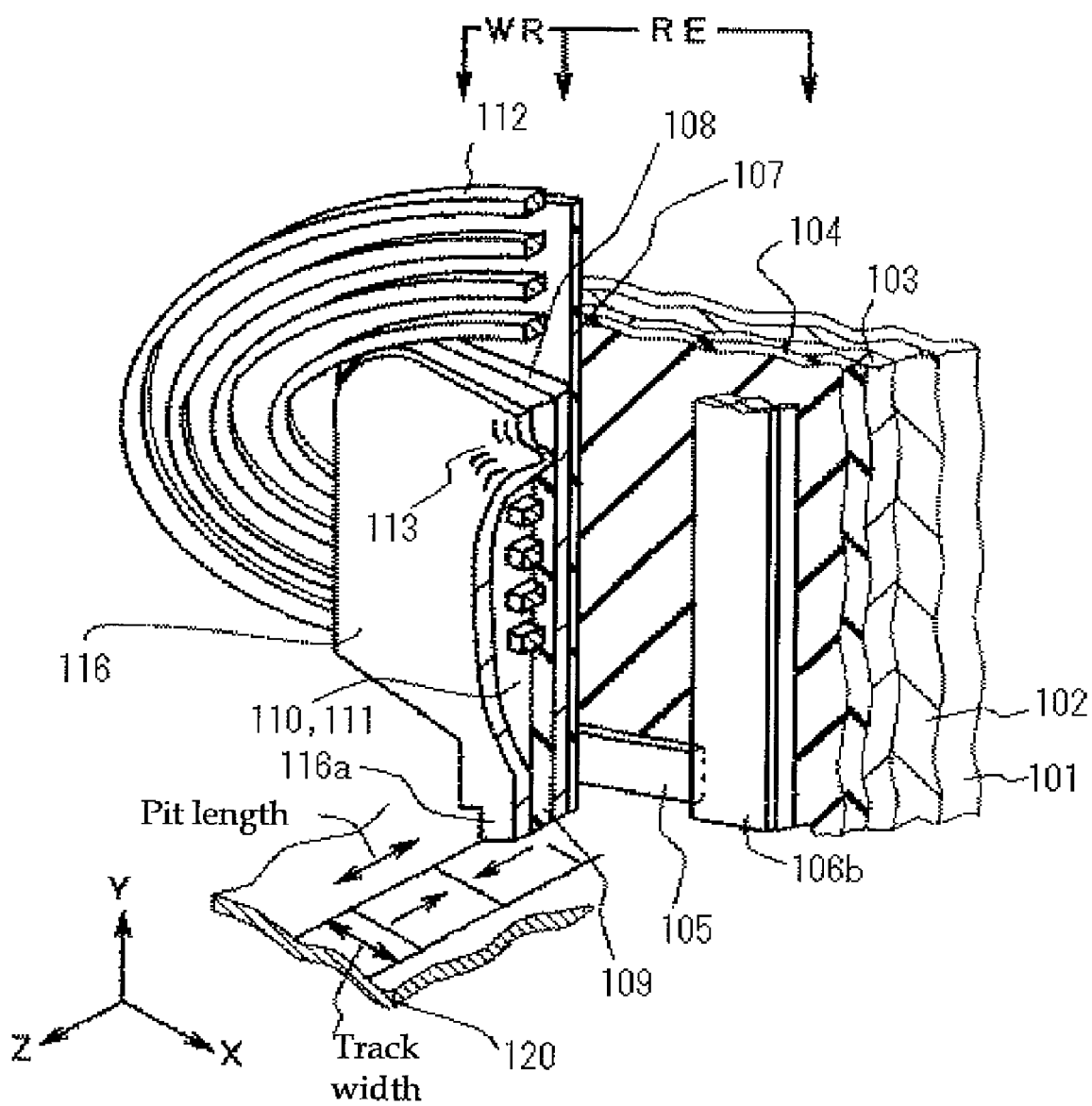
FIG. 19 is an exploded perspective view showing a principal portion of a composite magnetic head manufactured using the resist pattern forming process of the present invention.

FIG. 19 is an exploded perspective view showing a principal portion of a composite magnetic head. For a clear illustration of the inside of the magnetic head, illustration of an uppermost protection layer is omitted and, in the drawing of the recording head WR, the left half is removed.

The composite magnetic head shown in FIG. 19 includes a substrate 101, a substrate protection film 102 formed on the substrate 101, a reproduction head RE formed on the substrate protection film 102, a recording head WR formed on the reproduction head RE, and a protection layer 117 (not shown) formed on the recording head WR.

The reproduction head RE includes a lower magnetic shield layer 103, a first non-magnetic insulating layer (lower reproduction gap layer) 104 formed on the lower magnetic shield layer 103, a magnetic tranducer 105 formed on the first non-magnetic insulating layer 104, terminals 106a and 106b (note: only one of the two is illustrated) formed at either end of the magnetic tranducer 105, a second non-magnetic insulating layer (upper reproduction gap layer) 107 formed on the magnetic tranducer 105 and terminals 106*a* and 106*b*, and an upper reproduction magnetic shield layer 108 formed on the second non-magnetic insulating layer 107. To be more specific, the reproduction head RE has a configuration in which the magnetic tranducer 105 and terminals 106*a* and 106*b* are covered with the first and second non-magnetic insulating layer 104 and 107 in the Z direction, and in which the first and second non-magnetic insulating layer 104 and 107 are covered with the lower and upper magnetic shield layers 103 and 108.

The upper reproduction magnetic shield layer 108 is a merge-type one which also serves as a lower magnetic pole of the recording head WR to be described later, thereby serving as an upper reproduction magnetic shield and as a lower recording magnetic pole. Thus, hereinafter, the upper reproduction magnetic shield layer/lower recording magnetic pole 108 may also be referred to as an upper (reproduction) magnetic shield layer or a lower (recording) magnetic pole 108.

The recording head WR includes the lower recording magnetic pole 108, a recording gap layer 109, a spiral recording coil 112 arranged over the recording gap layer 109, third and fourth non-magnetic insulating layers 110 and 111 for covering the recording coil 112, and an upper recording magnetic pole 116 formed on the third and fourth non-magnetic insulating layers 110 and 111. To be more specific, the recording head WR has a configuration in which the gap layer 109 and third and fourth non-magnetic insulating layers 110 and 111 having the recording coil 112 embedded therein are covered with the lower and upper recording magnetic poles 108 and 116.

At the center space 113 of the recording coil 112, the upper recording magnetic pole 116 has a dent and connects to the lower recording magnetic pole 108. In addition, the upper magnetic pole 116 is tapered toward a magnetic recording medium 120. This tapered portion is specifically referred to as a pole 116*a*.

As described above, the composite magnetic head shown in FIG. 19 has a piggyback structure in which the recording head WR is attached to the back of the reproduction head RE. For a clear understanding of the positional relationship of the components of the magnetic head, the direction of the width of the magnetic head along its air bearing surface (ABS), the direction perpendicular to the surface of the magnetic recording disc 120, and the direction in which the components of the magnetic head are stacked on top of each other are defined as X direction, Y direction, and Z direction, respectively.

The components constituting such a composite magnetic head will be described below.

The substrate 101 is a wafer with a substantially disc shape made for instance of alumina-titanium carbide ($Al_2O_3TiC$), ferrite, or calcium titanate.

The substrate protection layer 102, first and second non-magnetic insulating layers 104 and 107, and recording gap layer 109 are all made for example of $Al_2O_3$. The gap layer 109 is about 0.2 μm to 0.6 μm in thickness. A magnetic field for recording on the magnetic recording medium 120 is generated at the pole 116*a* of the upper recording magnetic pole 116 and at the ABS of the lower recording magnetic pole 108, which the poles are covering the either side the gap layer 109.

The lower reproduction magnetic shield layer 103, the upper reproduction magnetic shield layer/lower recording magnetic pole 108, and upper recording magnetic pole 116 are all made for example of NiFe alloy. Alternatively, a Co alloy such as CoNiFe or CoZr, or an Fe alloy such as FeN or FeNZr can be used. The thickness of the upper recording magnetic pole 116 is about several micrometers.

For the magnetic tranducer 105, for example, anisotropic magnetoresistance (MR) effect elements, typically giant magnetoresistance (GMR) effect elements such as spin bulb magnetoresistance effect elements, can be used. The terminals 106*a* and 106*b* are connected to the ends of the magnetic tranducer 150, so that upon reading a constant current (sense current) flows into the magnetic tranducer 105 via these terminals.

The composite magnetic head is so positioned that it faces the recording medium 120 such as an optical disc, with a small distance (floatation amount) away from the recording medium 120. The composite magnetic head reads out magnetically recorded information from the magnetic recording medium 120 by scanning its track by means of the reproduction head RE, and magnetically writes information on the recording medium 120 by means of the recording head WR.

It should be noted that the surface of the magnetic head, which faces the magnetic recording medium 120, is referred to as the Air Bearing Surface (ABS).

Figure 20A:
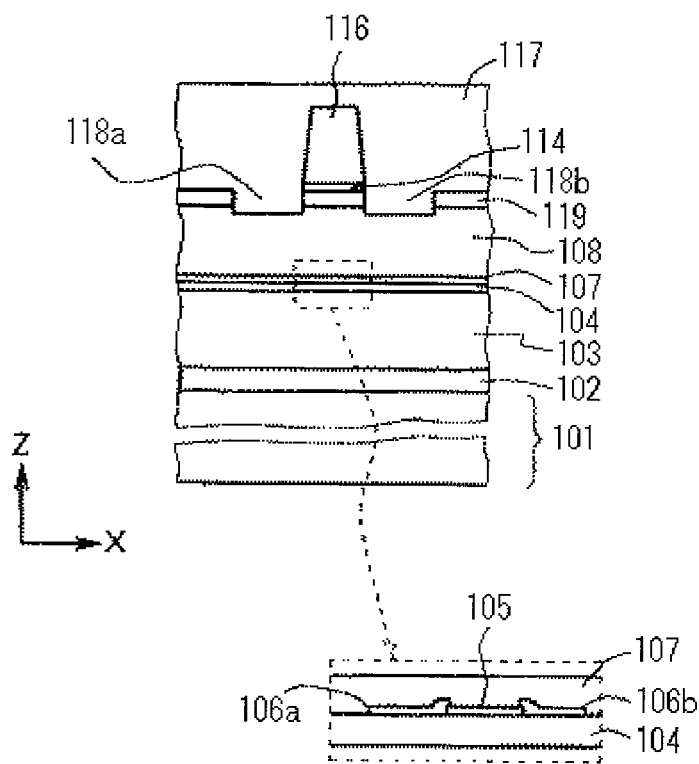
FIG. 20A is a cross sectional view of the magnetic head of FIG. 19, taken along the ABS plane and viewed from the recording medium side.
Figure 20B:
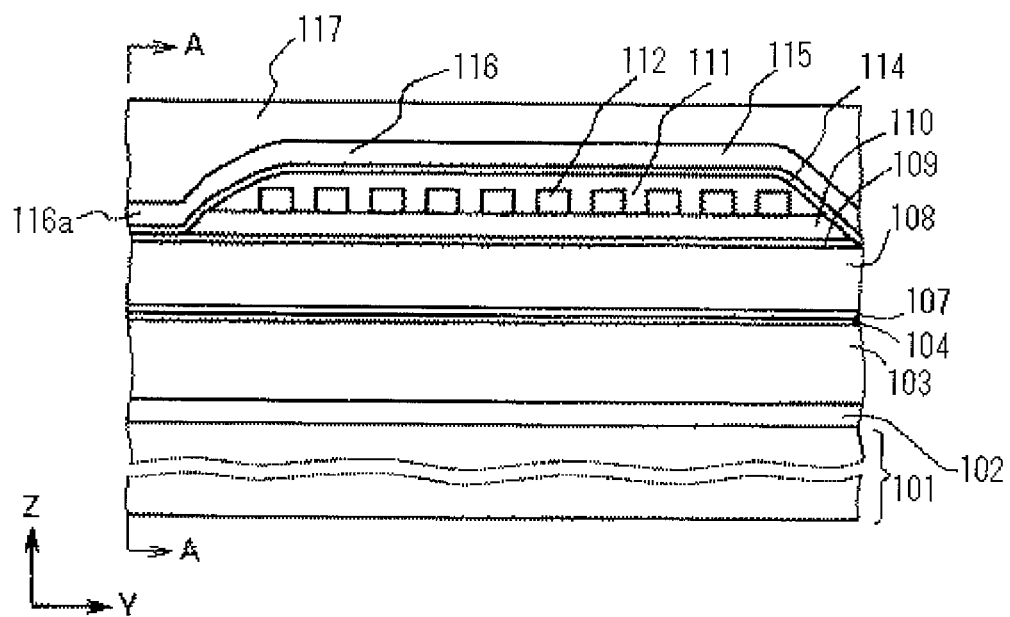
FIG. 20B is a cross sectional view of the magnetic head of FIG. 19, taken along the Y-Z plane cutting through the center of the recording coil.

FIG. 20A is a cross sectional view of the magnetic head taken along the ABS plane and viewed from the recording medium side. FIG. 20B is a cross sectional view of the magnetic head, taken along the Y-Z plane cutting through the center of the recording coil. FIG. 20A corresponds to the cross sectional view of FIG. 20B taken along the A-A' line.

As shown in FIGS. 20A and 20B, the magnetic head includes, in order from its bottom, the substrate 101, the protection layer 102 formed on the substrate 101, the lower magnetic shield layer 103 formed on the protection layer 102, the first non-magnetic insulating layer 104, the magnetic tranducer 105 formed on the first non-magnetic insulating layer 104, the terminals 106*a* and 106*b*, the second non-magnetic insulating layer 107 formed on the first non-magnetic insulating layer 104 so as to cover the magnetic tranducer 105 and terminals 106*a* and 106*b*, the upper magnetic shield layer/lower magnetic pole 108, the gap layer 109 formed on the lower magnetic pole 108, the third non-magnetic insulating layer 110 formed on the gap layer 109, the spiral recording coil 112 formed on the third non-magnetic insulating layer 110, the fourth non-magnetic insulating layer 111 covering the recording coil 112, a plating base layer 114 formed on the fourth non-magnetic insulating layer 111, an upper electrode 116 formed on the plating base layer 114, and a protection layer 117 formed on the upper electrode 116.

As shown in the partially enlarged view associated with FIG. 20A, the magnetic tranducer 105 is positioned in such a way that it is interposed between the first and second non-magnetic insulating layers 104 and 107, and the terminals 106*a* and 106*b* are connected to the ends of the magnetic tranducer 105.

As shown in FIG. 20B, in the magnetic head, the upper magnetic pole 116 has the pole 116*a* at the ABS, a tapered portion of the upper magnetic pole 116. Although details will be described later, over the surface of the lower electrode 108 facing the upper magnetic pole 116, a pair of concaves (trenches) 108*a* and 108*b* is formed at the bottom of either side of the pole 116*a*.

The manufacture of a composite magnetic head using the resist composition of the present invention will be described below.

FIGS. 21A to 21C and FIGS. 22A to 22C are all cross sectional views of a magnetic head that is in the process of manufacture, taken along the ABS plane of the magnetic head. FIGS. 23A to 23C and FIGS. 24A to 24C are all cross sectional views of a magnetic head that is in the process of manufacture, taken along the Y-Z plane cutting through the center of the recording coil of the magnetic head.

Figure 23A:
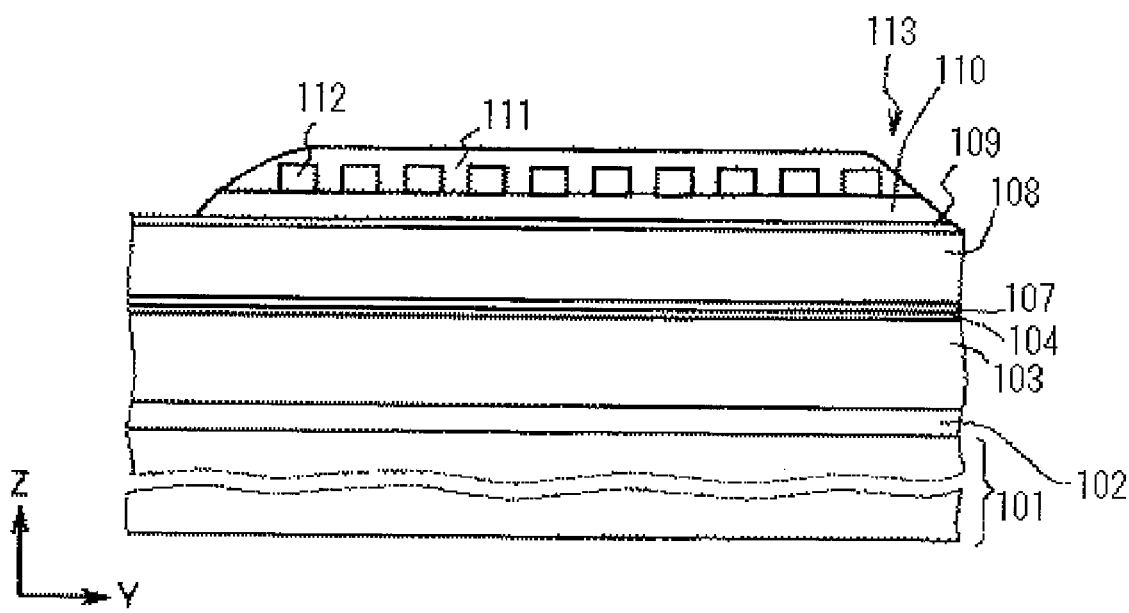
FIG. 23A is a view corresponding to FIG. 21A which shows manufacture of a magnetic head by means of the resist pattern forming process of the present invention, showing a cross sectional view taken along the Y-Z plane cutting through the center of the recording coil of the magnetic head.

The lower reproduction magnetic shield layer 103 was first formed. More specifically, as shown in FIG. 23A, the substrate 101 was prepared and the substrate protection film 102 was formed on the substrate 101, followed by formation of the lower reproduction magnetic shield layer 103 on the substrate protection film 102.

Subsequently, the first non-magnetic insulating layer (lower reproduction gap layer) 104 was formed on the lower reproduction magnetic shield layer 103.

The magnetic tranducer 105 and terminals 106a and 106b were then formed. More specifically, a MR film, GMR film or the like was formed on the first non-magnetic insulating layer 104, followed by patterning of the film to form the magnetic tranducer 105. The terminals 106a and 106b were then formed at the ends of the magnetic tranducer 105.

The second non-magnetic insulating layer (upper recording gap layer) 107 was then formed on the first non-magnetic insulating layer 104 so as to cover the magnetic tranducer 105 and terminals 106a and 106b.

The upper magnetic shield layer/lower magnetic pole 108 was formed on the second non-magnetic insulating layer 107. The lower magnetic pole 108 can be formed by electroplating or sputtering. When the lower magnetic pole 108 is to be formed by electroplating, the plating base layer 104 is first formed by sputtering or vapor deposition of a NiFe alloy or a Co alloy such as CoNiFe, followed by electroplating to thicken the coating to a thickness of several micrometers. When the lower magnetic pole 108 is to be formed by sputtering, Fe alloys such as FeN and FeNZr, and Co alloys such as CoZr are used. In the case of sputtering, there is no need to provide the plating base layer.

The recording gap layer 109 was formed on the lower recording magnetic pole 108. The recording gap layer 109 was formed using, for example, $Al_2O_3$ or $SiO_2$.

Note, however, that the single use of films with a high etching rate—for example $SiO_2$ films—for the recording gap layer 109 may cause reduction in the thickness of the resulting recording gap layer 109 in the subsequent steps of forming a third non-magnetic insulating layer (thermally-cured layer of the resist), a recording coil and a fourth non-magnetic insulating layer (thermally-cured layer of the resist). To avoid this, a gap protection layer may be provided on the recording gap layer 109.

The third non-magnetic insulating layer 110 was then formed on the gap layer 109 by applying a positive-type resist over the gap layer 109 by spin coating, patterning the resist to remove portions corresponding to the center space of the spiral recording coil 112 to be formed, and thermally curing the resist (hard curing).

The recording coil 112 was then formed.

The fourth non-magnetic insulating layer 11 was formed on the third non-magnetic insulating layer (a resist pattern formed using the resist composition of the present invention) so as to cover the recording coil 12.

Figure 21A:
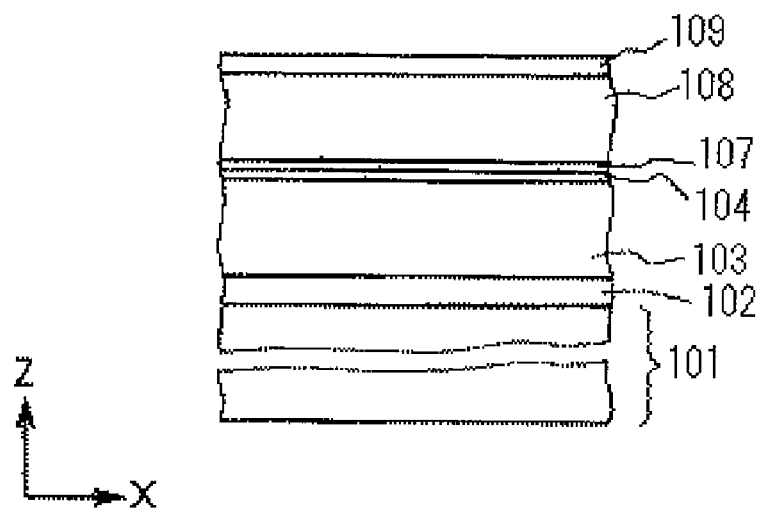
FIG. 21A is a schematic explanatory view of manufacture of a magnetic head by means of the resist pattern forming process of the present invention, showing a cross sectional view taken along the ABS plane of the magnetic head.

FIGS. 21A and 23A illustrate the shape of the magnetic head in this process. The same process that applied to the formation of the third non-magnetic insulating layer 110 was applied to the formation of the fourth non-magnetic insulating layer: The fourth non-magnetic insulating layer 111 was formed by applying a positive-type resist over the third non-magnetic insulating layer by spin coating, patterning the resist to remove portions corresponding to the center space of the spiral recording coil 112, and thermally curing the resist (hard curing). In this way a hole 113 reaching the lower magnetic pole 108 was formed at the center of the recording coil 112. The hole 113 may be created after the formation of the third and fourth non-magnetic insulating layers 110 and 111.

Figure 21B:
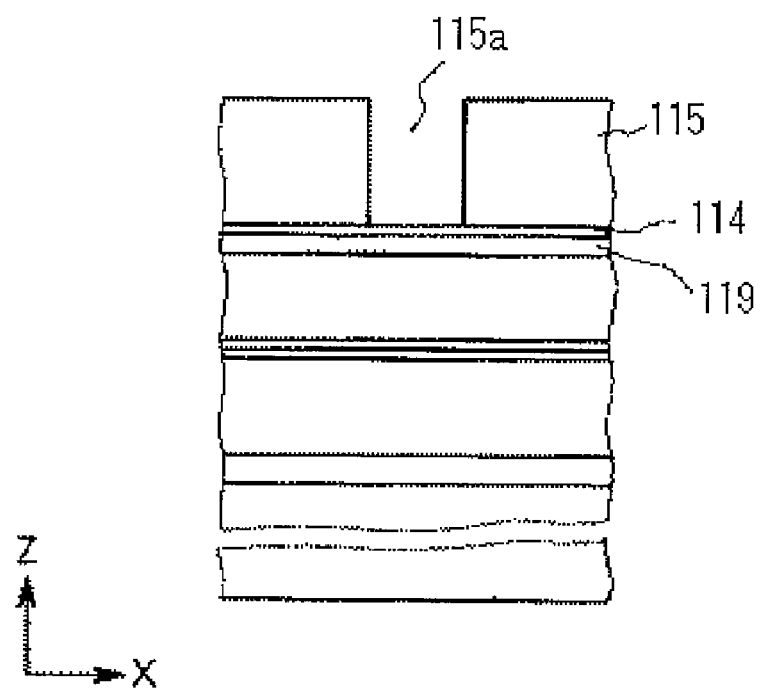
FIG. 21B is a schematic explanatory view of manufacture of a magnetic head by means of the resist pattern forming process of the present invention, showing a step conducted after the step shown in FIG. 21A.
Figure 23B:
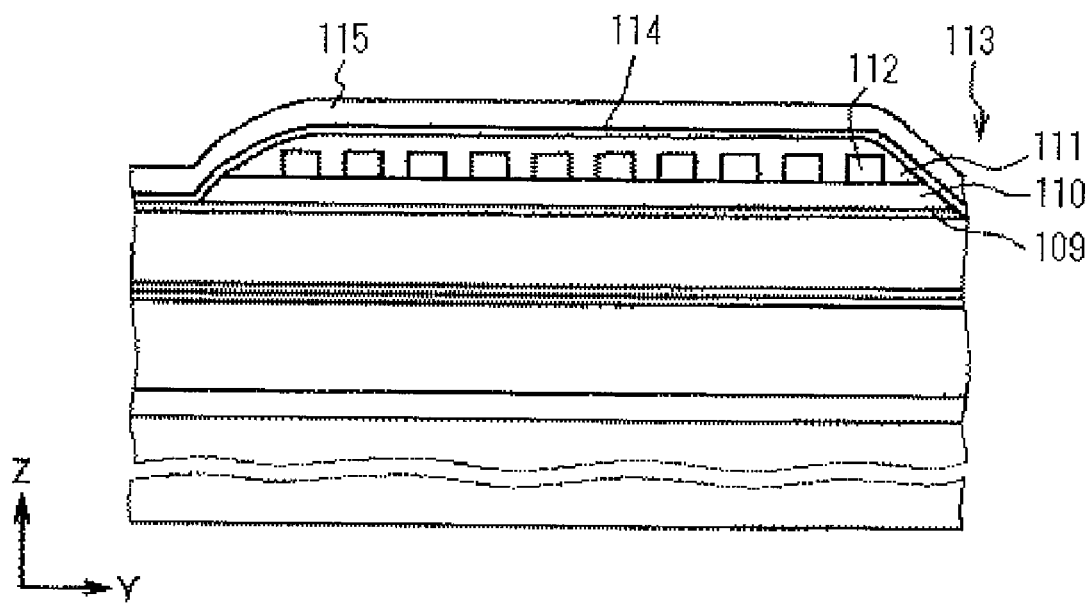
FIG. 23B is a view corresponding to FIG. 21B which shows manufacture of a magnetic head by means of the resist pattern forming process of the present invention, showing a step conducted after the step shown in FIG. 23A.

As shown in FIGS. 21B and 23B, the plating base layer 114 was formed. More specifically, a thin plating base layer made of NiFe was formed over the fourth non-magnetic insulating layer 111 and gap layer 109, including the hole 113, by sputtering, vapor deposition or the like.

The upper magnetic pole 116 was formed. More specifically, the resist composition prepared in Example 10 was applied over the plating base layer 114 to form a resist film 115, and the resist film 115 was exposed and developed to form an opening 115a in the area in which the upper magnetic pole is to be formed.

Figure 21C:
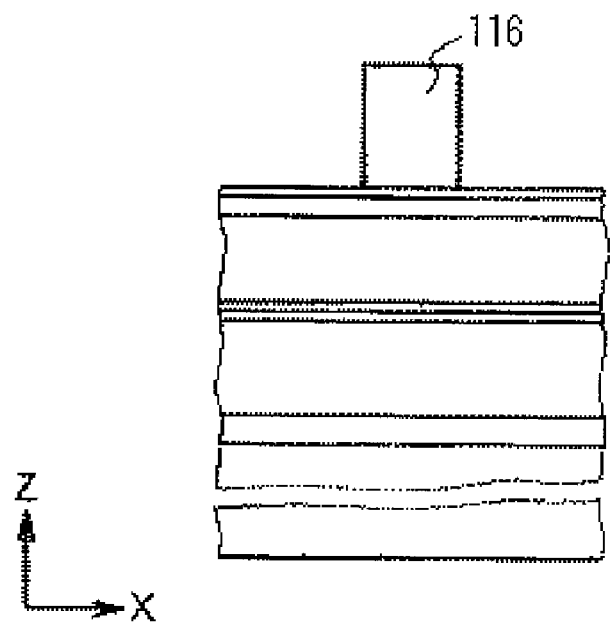
FIG. 21C is a schematic explanatory view of manufacture of a magnetic head by means of the resist pattern forming process of the present invention, showing a step conducted after the step shown in FIG. 21B.
Figure 23C:
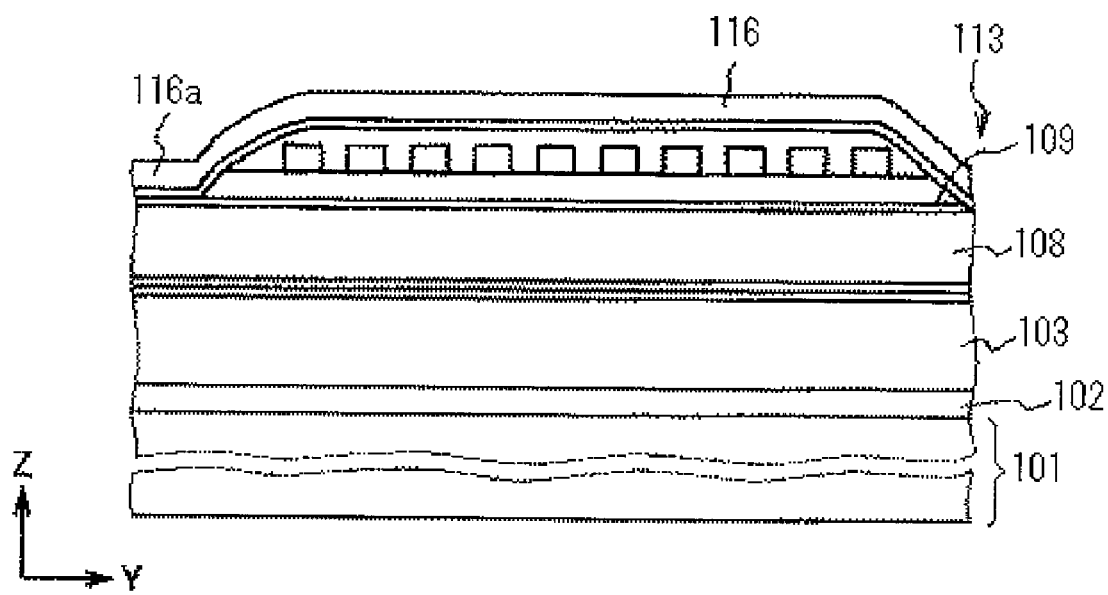
FIG. 23C is a view corresponding to FIG. 21C which shows manufacture of a magnetic head by means of the resist pattern forming process of the present invention, showing a step conducted after the step shown in FIG. 23B.

As shown in FIG. 21C and FIG. 23C, the upper magnetic pole 116 made of NiFe was formed in the opening 115a of the resist film 115 to a thickness of several micrometers by electroplating. The upper magnetic pole 116 is tapered toward the magnetic recording medium 120, forming a long and thin pole 116a facing the medium 120. Furthermore, the upper magnetic pole 116 is connected to the lower magnetic pole 108 through the hole 113 located at the center space of the spiral recording coil 112.

Figure 22A:
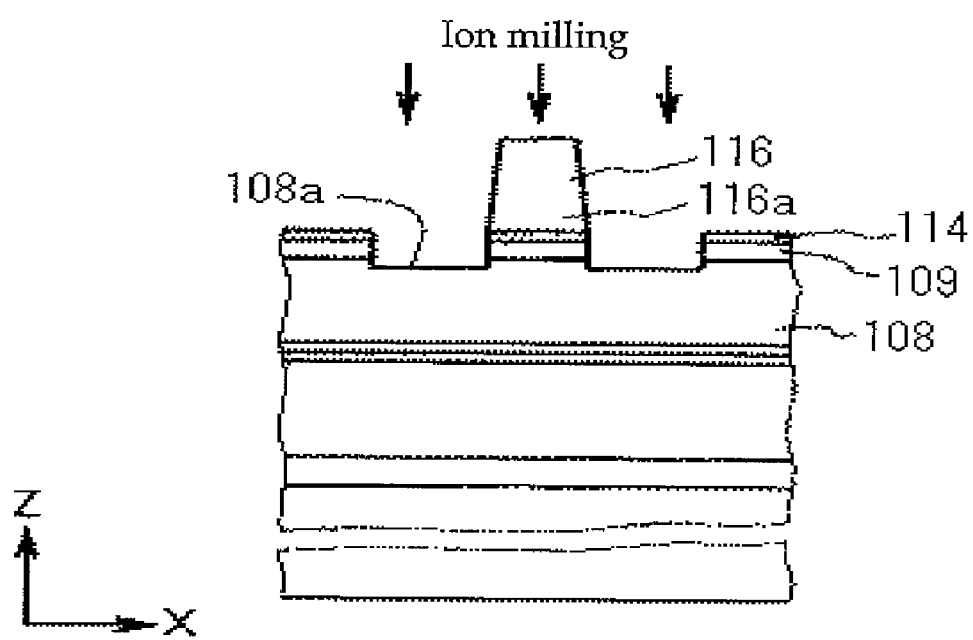
FIG. 22A is a schematic explanatory view of manufacture of a magnetic head by means of the resist pattern forming process of the present invention, showing a step conducted after the step shown in FIG. 21C.
Figure 24A:
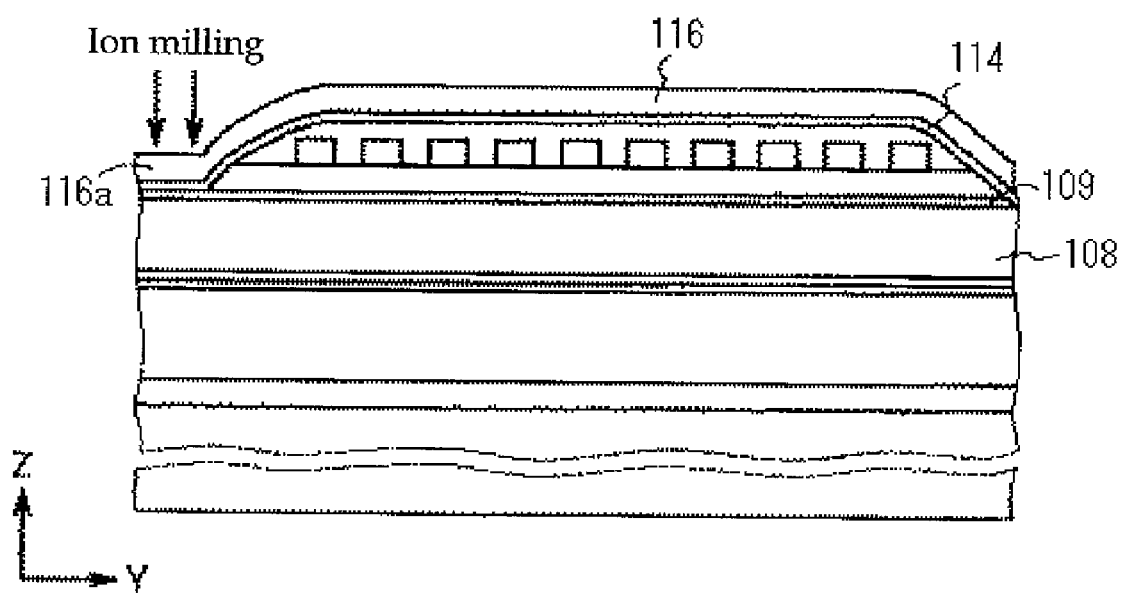
FIG. 24A is a view corresponding to FIG. 22A which shows manufacture of a magnetic head by means of the resist pattern forming process of the present invention, showing a step conducted after the step shown in FIG. 23C.

Next, as illustrated in FIG. 22A and FIG. 24A, the pole 116a of the upper magnetic pole 116 and the upper portion of the lower magnetic pole 108 were partially trimmed by ion milling to have a predetermined shape. More specifically, before dividing the substrate 101, both sides of the pole 116a contacting the gap layer 109 within the upper magnetic pole 116 were trimmed by ion milling to provide a predetermined shape. Simultaneously, the lower magnetic pole 108 located at the bottom of the pole 116a was partially trimmed and a trench or concave 108a of predetermined shape was formed in the upper portion of the lower magnetic pole 108.

Figure 22B:
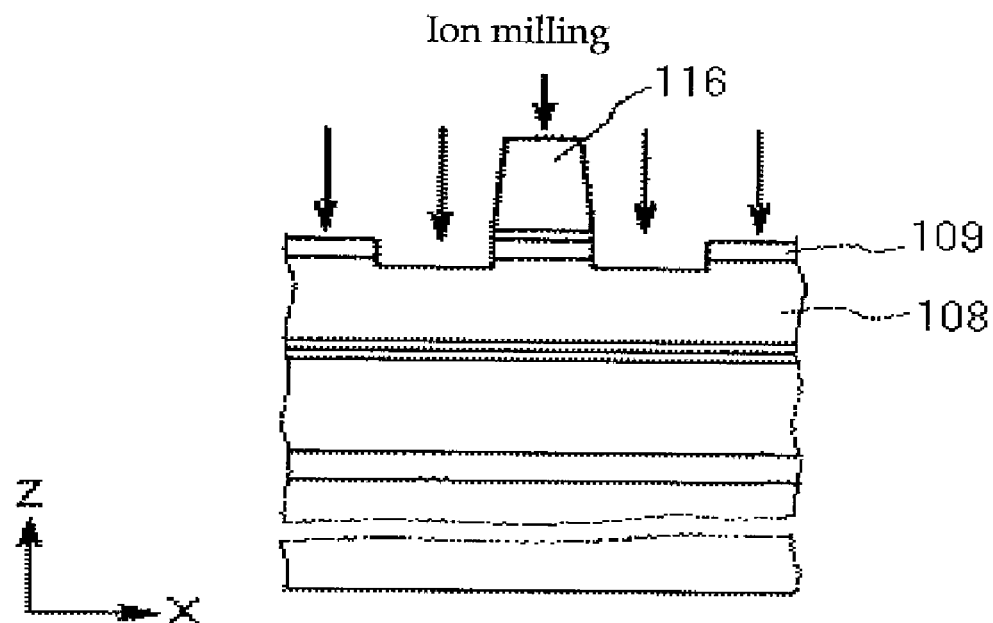
FIG. 22B is a schematic explanatory view of manufacture of a magnetic head by means of the resist pattern forming process of the present invention, showing a step conducted after the step shown in FIG. 22A.
Figure 24B:
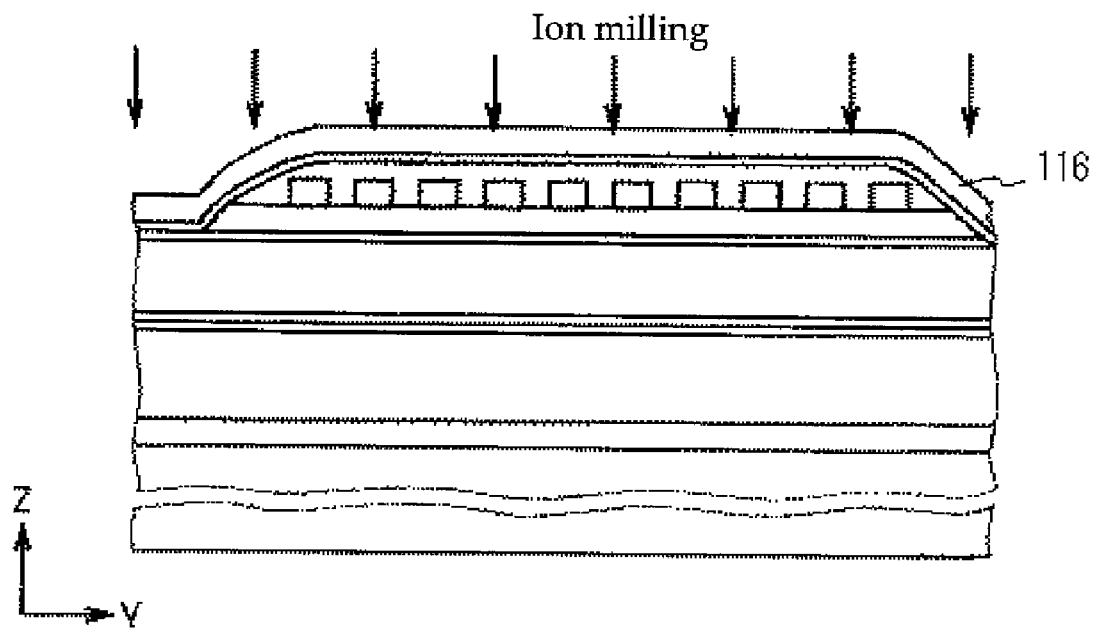
FIG. 24B is a view corresponding to FIG. 22B which shows manufacture of a magnetic head by means of the resist pattern forming process of the present invention, showing a step conducted after the step shown in FIG. 24A.

Thereafter, as shown in FIGS. 22B and 24B, the exposed areas of the plated base layer 114 other than the upper magnetic pole 116 were removed by ion milling. Ion milling reduces the thickness of the upper magnetic pole 116 by an amount corresponding to the thickness of the plated base layer 114 at this point, however, since the plating base layer 114 is made of the same material as the upper magnetic pole 116, the plated base layer 114 remained at the bottom of the upper magnetic pole 116 is incorporated into the upper magnetic pole 116. Thus the thickness of the upper magnetic pole 116 returns to the original thickness. Thereafter, electrode pads (not shown) attached to the ends of the magnetic tranducer 105, electrode pads (not shown) attached to the ends of the recording coil 112, etc., were formed.

This trimming process may be performed at any desired time between the formation of the upper magnetic pole and the formation of the protection layer. The operation time of partial trimming of the pole 116a and the lower magnetic pole 108 can be greatly reduced compared to conventional trimming that involves irradiation of focused ion beams. As a result, the manufacturing time and manufacturing cost of the magnetic head are also reduced. The reason for this is that while the focused ion milling requires focusing of ion beams and produces magnetic heads one-by-one, ion milling employed in this Example requires no focusing and can achieve trimming for about 10,000 heads arranged on one substrate at a time.

Figure 22C:
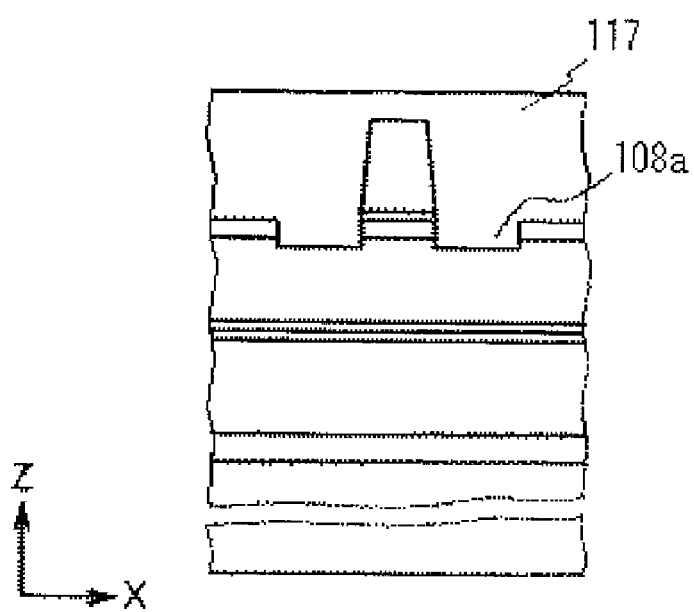
FIG. 22C is a schematic explanatory view of manufacture of a magnetic head by means of the resist pattern forming process of the present invention, showing a step conducted after the step shown in FIG. 22B.
Figure 24C:
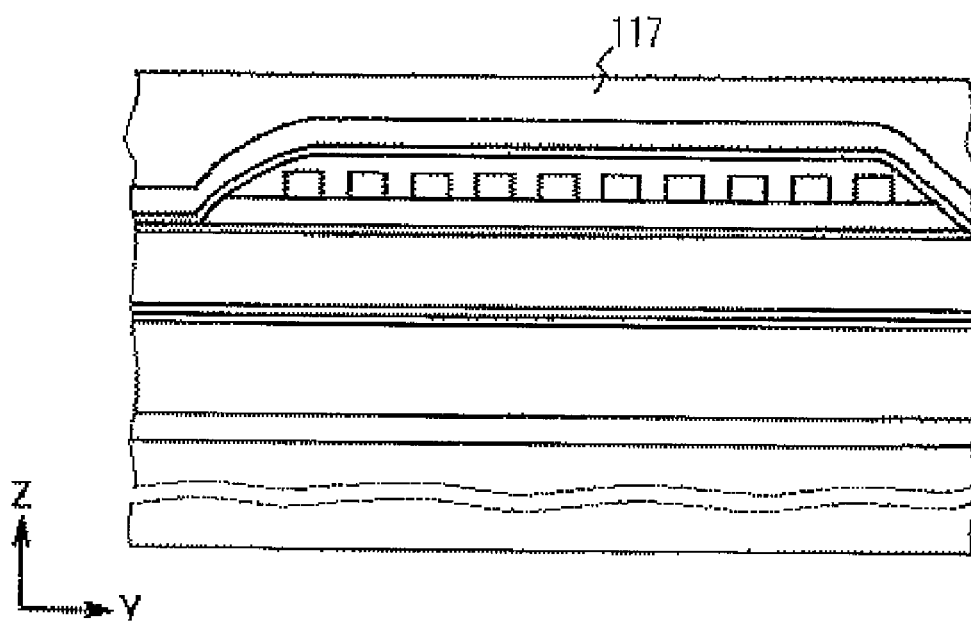
FIG. 24C is a view corresponding to FIG. 22C which shows manufacture of a magnetic head by means of the resist pattern forming process of the present invention, showing a step conducted after the step shown in FIG. 24B.
Figure 25A:
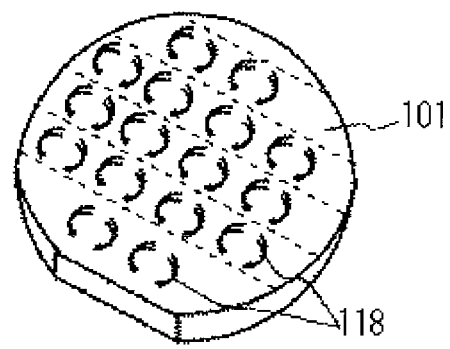
FIG. 25A is a schematic explanatory view showing a state where a plurality of magnetic heads has been formed on a wafer.
Figure 25B:
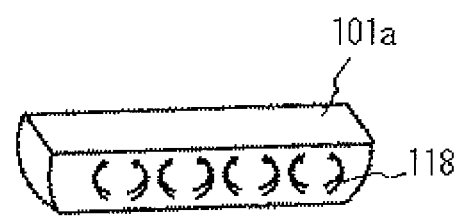
FIG. 25B is a schematic explanatory view showing one of the bar-shaped articles cut out from the wafer of FIG. 25A.
Figure 25C:
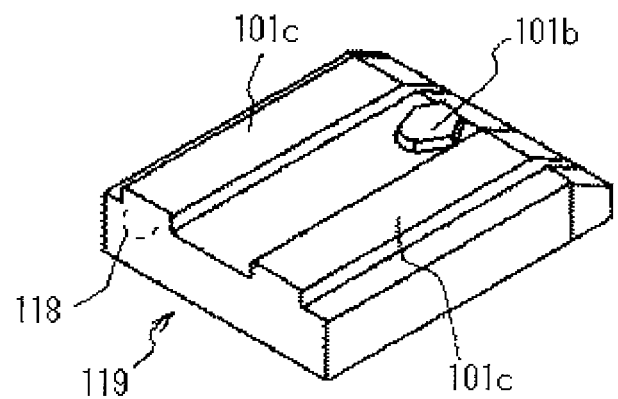
FIG. 25C is a schematic explanatory view showing a slider formed from the bar-shaped article of FIG. 25B.
Figure 26A:
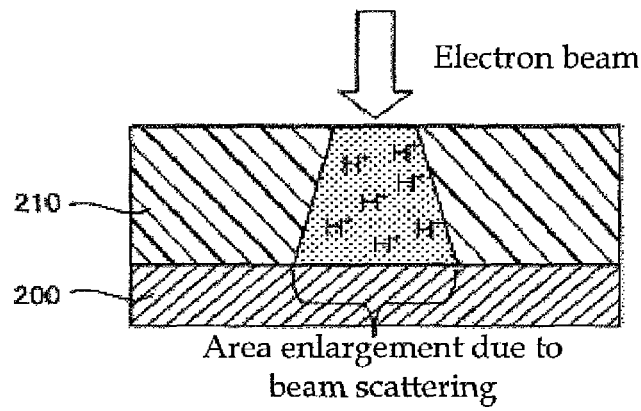
FIG. 26A is a schematic explanatory view showing a conventional positive-type resist film irradiated with an electron beam.
Figure 26B:
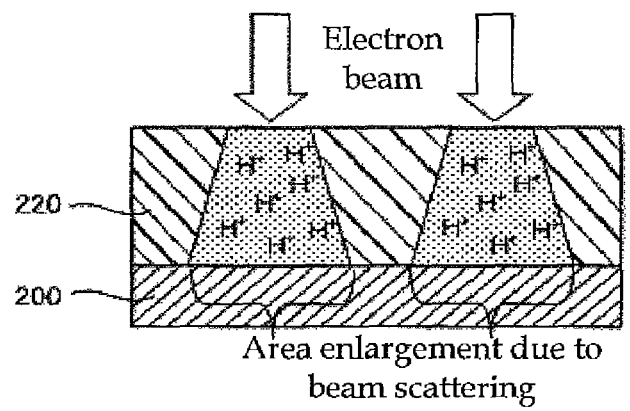
FIG. 26B is a schematic explanatory view showing a conventional negative-type resist film irradiated with an electron beam.
Figure 26C:
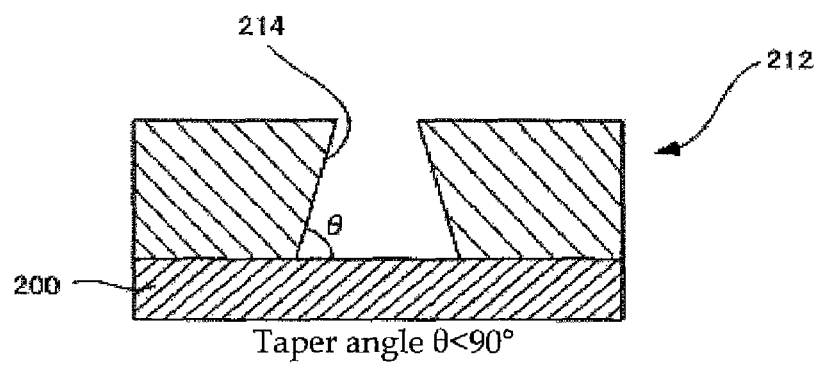
FIG. 26C is a schematic explanatory view showing a resist pattern prepared using the conventional positive-type resist film.
Figure 26D:
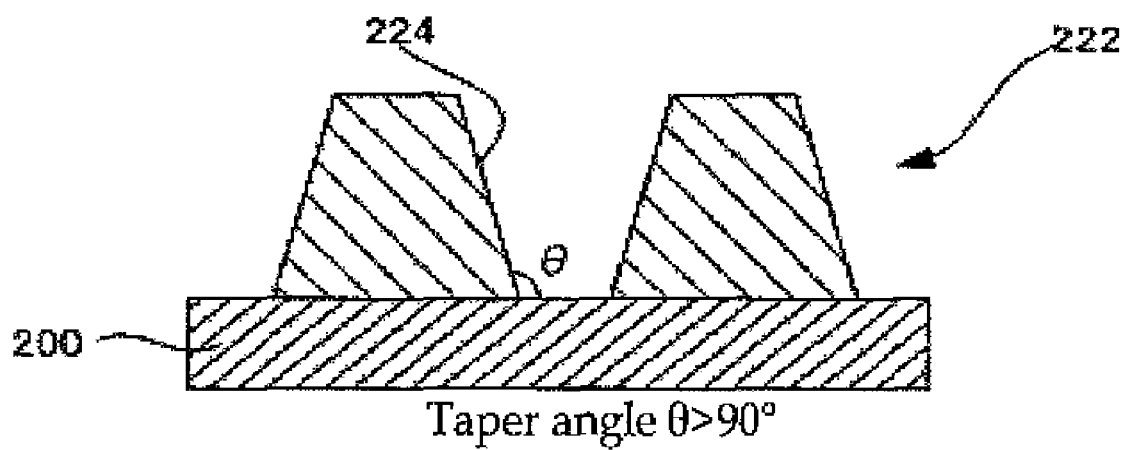
FIG. 26D is a schematic explanatory view showing a resist pattern prepared using the conventional negative-type resist film.

As shown in FIG. 22C and FIG. 24C, the protection layer 117 made for example of $Al_2O_3$ was formed so as to cover almost entire surface of the upper magnetic pole 116. The trenches 108a that are formed in the lower magnetic pole 8 at either bottom side of the pole 116a were filled with the protection layer 117. The substrate 101 was then divided into several slider bars. Note that the substrate 101 had been subjected to the foregoing steps as a single piece rather than as sliders. Thus, as shown in FIG. 25A, multiple magnetic heads 118 (approximately 10,100 pieces per 5-inch wafer) are arrayed on the substrate 101. The sliders were prepared in the following manner: As shown in FIG. 25B, the substrate 101 was divided into several bar-shaped articles 101a and, as shown in FIG. 25C, rail surfaces 101b and 101c were provided to each of the articles 101a. Thereafter, the articles 101a were processed to form sliders 119.

In this way a composite magnetic head shown in FIG. 19 was manufactured that includes both the reproduction head RE and recording head WR.

In this Example since resist patterns formed using the resist composition of the present invention were used upon formation of the magnetic head components such as the upper magnetic pole, it succeeded in manufacture of magnetic heads with high dimension accuracies.

According to the present invention, it is possible to solve the foregoing conventional problems and to provide a resist composition capable of prevention of the formation of abnormal resist pattern shapes for efficient, high-precision formation of fine, high-resolution resist patterns, a resist pattern forming process capable of efficient, high-precision formation of finer, high-resolution resist patterns by using the resist composition, and a method for manufacturing a semiconductor device, which the method capable of formation of a fine, high-resolution resist pattern by preventing the occurrence of abnormal pattern shape by using the resist composition, and of efficient mass production of semiconductor devices with fine interconnection patterns formed using the resist pattern.

The resist composition of the present invention can be suitably used for various types of patterning methods, various types of methods for manufacturing a semiconductor device, etc., particularly for the resist pattern forming process of the present invention and the method of the present invention for manufacturing a semiconductor device.

The resist pattern forming process of the present invention can be suitably used in the manufacture of functional parts such as mask patterns, reticle patterns, magnetic heads, liquid crystal displays (LCDs), plasma display panels (PDPs) and surface acoustic wave filters (SAW filters); optical parts for optical interconnection; fine parts such as microactuators; and semiconductor devices, and can be employed most preferably in the method of the present invention for manufacturing a semiconductor device.

The method of the present invention for manufacturing a semiconductor device can be suitably used for the manufacture of various types of semiconductor devices such as flash memories, DRAMs, and PRAMs.

What is claimed is:

1. A resist composition comprising:
a base resin; a photoacid generator; a first additive; a second additive; and a third additive,
wherein at least any one of the first additive and the second additive is one selected from the group consisting of: formic acid, acetic acid, lactic acid, butyric acid, valeric acid, vinyl acetic acid, propionic acid, succinic acid, benzoic acid, fumaric acid, and malonic acid, and
wherein the pKa of the second additive is higher than the pKa of the first additive, and at a resist formation temperature, the vapor pressure of the second additive is lower than the vapor pressure of the first additive, and
wherein the pKa of the third additive is higher than the pKa of the second additive and, at the resist formation temperature, the vapor pressure of the third additive is lower than the vapor pressure of the second additive.

2. The resist composition according to claim 1, wherein the pKa of the second additive is higher than the pKa of the first additive by 2 or more.

3. The resist composition according to claim 1, wherein the pKa of each of the first additive and the second additive is 4 or more.

4. The resist composition according to claim 1, wherein at the resist formation temperature, the vapor pressure of the second additive is lower than the vapor pressure of the first additive by 26.66 kPa (200 Torr) or more.

5. The resist composition according to claim 1, wherein at the resist formation temperature, the vapor pressure of each of the first additive and the second additive is 101.308 kPa (760 Torr) or less.

6. The resist composition according to claim 1, wherein the mole ratio of the first additive to the second additive, added in the resist composition, is in the range of 1/10 to 10/1.

7. The resist composition according to claim 1, wherein the third additive is at least one selected from the group consisting of carboxylic acids and nitrogen-containing compounds.

8. The resist composition according to claim 1, wherein the base resin is at least one selected from the group consisting of novolac resins, polyvinylphenol resins, acrylic resins, cycloolefin resins, and derivatives thereof.

9. The resist composition according to claim 1, wherein the base resin has an acid-cleavable protecting group.

10. The resist composition according to claim 1, further comprising:
an organic solvent,
wherein the resist composition is a positive-type resist composition.

11. The resist composition according to claim 1, further comprising:
a surfactant.

12. A method for manufacturing a semiconductor device, comprising:
forming a resist pattern over a work surface by means of a resist pattern forming process; and
patterning the work surface by etching using the resist pattern as a mask,
wherein the resist pattern forming process comprises applying a resist composition over the work surface, heating the resist composition to form a resist film over the work surface, selectively irradiating the resist film with ionized radiation, heating the resist film that has been irradiated with the ionized radiation, and developing the resist film,
wherein the resist composition comprises a base resin, a photoacid generator, a first additive, a second additive, and a third additive,
wherein at least any one of the first additive and the second additive is one selected from the group consisting of: formic acid, acetic acid, lactic acid, butyric acid, valeric acid, vinyl acetic acid, propionic acid, succinic acid, benzoic acid, fumaric acid, and malonic acid, and
wherein the pKa of the second additive is higher than the pKa of the first additive, and at a resist formation temperature, the vapor pressure of the second additive is lower than the vapor pressure of the first additive, and
wherein the pKa of the third additive is higher than the pKa of the second additive and, at the resist formation temperature, the vapor pressure of the third additive is lower than the vapor pressure of the second additive.

13. The method for manufacturing a semiconductor device according to claim 12, wherein the heating temperature adopted upon formation of the resist film is 40° C. to 150° C.

14. The method for manufacturing a semiconductor device according to claim 12, wherein the heating temperature adopted upon heating of the resist film irradiated with the ionized radiation is 50° C. to 200° C.

15. The method for manufacturing a semiconductor device according to claim 12, wherein the ionized radiation is a charged particle beam.

16. A resist composition comprising:

a base resin; a photoacid generator; a first additive; a second additive; and a third additive wherein the base resin is at least one selected from the group consisting of novolac resins, polyvinylphenol resins, acrylic resins, cycloolefin resins, and derivatives thereof, wherein at least any one of the first additive and the second additive is one selected from the group consisting of: formic acid, acetic acid, lactic acid, butyric acid, valeric acid, vinyl acetic acid, propionic acid, succinic acid, benzoic acid, fumaric acid, and malonic acid, and wherein the pKa of the second additive is higher than the pKa of the first additive, and at a resist formation temperature, the vapor pressure of the second additive is lower than the vapor pressure of the first additive.

wherein the pKa of the third additive is higher than the pKa of the second additive and, at the resist formation temperature, the vapor pressure of the third additive is lower than the vapor pressure of the second additive.

17. A method for manufacturing a semiconductor device, comprising:

forming a resist pattern over a work surface by means of a resist pattern forming process; and patterning the work surface by etching using the resist pattern as a mask, wherein the resist pattern forming process comprises applying a resist composition over the work surface, heating the resist composition to form a resist film over the work surface, selectively irradiating the resist film with ionized radiation, heating the resist film that has been irradiated with the ionized radiation, and developing the resist film, wherein the resist composition comprises a base resin, a photoacid generator, a first additive, a second additive, and a third additive, and wherein the base resin is at least one selected from the group consisting of novolac resins, polyvinylphenol resins, acrylic resins, cycloolefin resins, and derivatives thereof, wherein at least any one of the first additive and the second additive is one selected from the group consisting of: formic acid, acetic acid, lactic acid, butyric acid, valeric acid, vinyl acetic acid, propionic acid, succinic acid, benzoic acid, fumaric acid, and malonic acid, and wherein the pKa of the third additive is higher than the pKa of the second additive and, at the resist formation temperature, the vapor pressure of the third additive is lower than the vapor pressure of the second additive.

* * * * *